(12) United States Patent
Katoh

(10) Patent No.: US 11,961,828 B2
(45) Date of Patent: Apr. 16, 2024

(54) SEMICONDUCTOR DEVICE

(71) Applicant: DENSO CORPORATION, Kariya (JP)

(72) Inventor: Nobuyuki Katoh, Kariya (JP)

(73) Assignee: DENSO CORPORATION, Kariya (JP)

( * ) Notice: Subject to any disclaimer, the term of this patent is extended or adjusted under 35 U.S.C. 154(b) by 392 days.

(21) Appl. No.: 17/490,448

(22) Filed: Sep. 30, 2021

(65) Prior Publication Data

US 2022/0020730 A1     Jan. 20, 2022

Related U.S. Application Data

(63) Continuation of application No. PCT/JP2020/006715, filed on Feb. 20, 2020.

(30) Foreign Application Priority Data

Apr. 5, 2019   (JP) ................ 2019-073009

(51) Int. Cl.
    *H01L 25/07*    (2006.01)
    *H01L 23/00*    (2006.01)
    (Continued)

(52) U.S. Cl.
CPC ............ *H01L 25/072* (2013.01); *H01L 23/34* (2013.01); *H01L 23/473* (2013.01); *H01L 24/32* (2013.01);
(Continued)

(58) Field of Classification Search
CPC ........... H01L 23/3171; H01L 21/02164; H01L 21/31116; H01L 23/291; H01L 23/3107; H01L 23/3675; H01L 24/32; H01L 24/48; H01L 24/73; H01L 27/0664; H01L 29/45; H01L 29/66333; H01L 29/7395; H01L 2224/32245; H01L 2224/48175; H01L 2224/73265; H01L 2924/10253; H01L 2924/10254; H01L 2924/10272; H01L 2924/1033; H01L 2924/1067;
(Continued)

(56) References Cited

U.S. PATENT DOCUMENTS

2009/0201708 A1    8/2009   Ohkouchi et al.

FOREIGN PATENT DOCUMENTS

| JP | H4-354156 A | 12/1992 |
|---|---|---|
| JP | 2013-030579 A | 2/2013 |
| JP | 5167728 B2 | 3/2013 |

*Primary Examiner* — Robert G Bachner
(74) *Attorney, Agent, or Firm* — POSZ LAW GROUP, PLC

(57) ABSTRACT

A semiconductor device includes a heat dissipation member, multiple switching elements, and multiple signal terminals. The switching elements include a first switching element formed on a silicon substrate and a second switching element formed on a silicon carbide substrate, and include at least one of the first switching element or the second switching element in a plural number Each of the switching elements includes a temperature sense pad. The first switching element and the second switching element are alternately arranged in a predetermined direction in which a refrigerant flows. In the switching elements of same type as the switching element disposed on a most downstream side in the predetermined direction, the signal terminal corresponding to the temperature sense pad is provided for the switching element disposed on the most downstream side, and is not provided for the switching elements disposed on more upstream side.

7 Claims, 30 Drawing Sheets

(51) Int. Cl.
*H01L 23/34* (2006.01)
*H01L 23/473* (2006.01)
*H01L 25/18* (2023.01)
*H02P 27/08* (2006.01)

(52) U.S. Cl.
CPC .... *H01L 25/18* (2013.01); *H01L 2224/32245* (2013.01); *H01L 2924/10253* (2013.01); *H01L 2924/10272* (2013.01); *H01L 2924/13055* (2013.01); *H01L 2924/13091* (2013.01); *H01L 2924/14252* (2013.01); *H02P 27/08* (2013.01)

(58) Field of Classification Search
CPC ... H01L 2924/1203; H01L 2924/13055; H01L 21/3105; H01L 23/051; H01L 21/32131; H01L 21/78; H01L 24/03; H01L 24/33; H01L 24/83; H01L 24/06; H01L 24/29; H01L 2224/02166; H01L 2224/0219; H01L 2224/0383; H01L 2224/04026; H01L 2224/04042; H01L 2224/05019; H01L 2224/05073; H01L 2224/05124; H01L 2224/05138; H01L 2224/05147; H01L 2224/05155; H01L 2224/05164; H01L 2224/05166; H01L 2224/05169; H01L 2224/05554; H01L 2224/05639; H01L 2224/05644; H01L 2224/05655; H01L 2224/05664; H01L 2224/05669; H01L 2224/26175; H01L 2224/29111; H01L 2224/29147; H01L 2224/29155; H01L 2224/45099; H01L 2224/83007; H01L 2224/83444; H01L 2224/83447; H01L 2224/83455; H01L 2224/83801; H01L 23/3192; H01L 23/562; H01L 2224/48247; H01L 24/05; H01L 2224/0603; H01L 2224/06181; H01L 2224/48091; H01L 2924/00014; H01L 2924/181; H01L 23/4334; H01L 23/49503; H01L 21/4825; H01L 23/3672; H01L 23/49548; H02P 27/08
See application file for complete search history.

UPSTREAM ←——————————→ DOWNSTREAM

UPSTREAM ←——————→ DOWNSTREAM

UPSTREAM ←―――――――→ DOWNSTREAM

SEMICONDUCTOR DEVICE

CROSS REFERENCE TO RELATED APPLICATIONS

The present application is a continuation application of International Patent Application No. PCT/JP2020/006715 filed on Feb. 20, 2020, which designated the U.S. and claims the benefit of priority from Japanese Patent Application No. 2019-073009 filed on Apr. 5, 2019. The entire disclosures of all of the above applications are incorporated herein by reference.

TECHNICAL FIELD

The present disclosure relates to a semiconductor device.

BACKGROUND

Conventionally, there has been known a semiconductor device including a first switching element formed on a silicon (Si) substrate and a second switching element formed on a silicon carbide (SiC) substrate.

SUMMARY

The present disclosure provides a semiconductor device including a heat dissipation member, multiple switching elements, and multiple signal terminals. The switching elements include a first switching element formed on a Si substrate and a second switching element formed on a SiC substrate, and include at least one of the first switching element or the second switching element in a plural number Each of the switching elements includes a temperature sense pad. The first switching element and the second switching element are alternately arranged in a predetermined direction in which a refrigerant flows. In the switching elements of same type as the switching element disposed on a most downstream side in the predetermined direction, the signal terminal corresponding to the temperature sense pad is provided for the switching element disposed on the most downstream side, and is not provided for the switching elements disposed on more upstream side.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
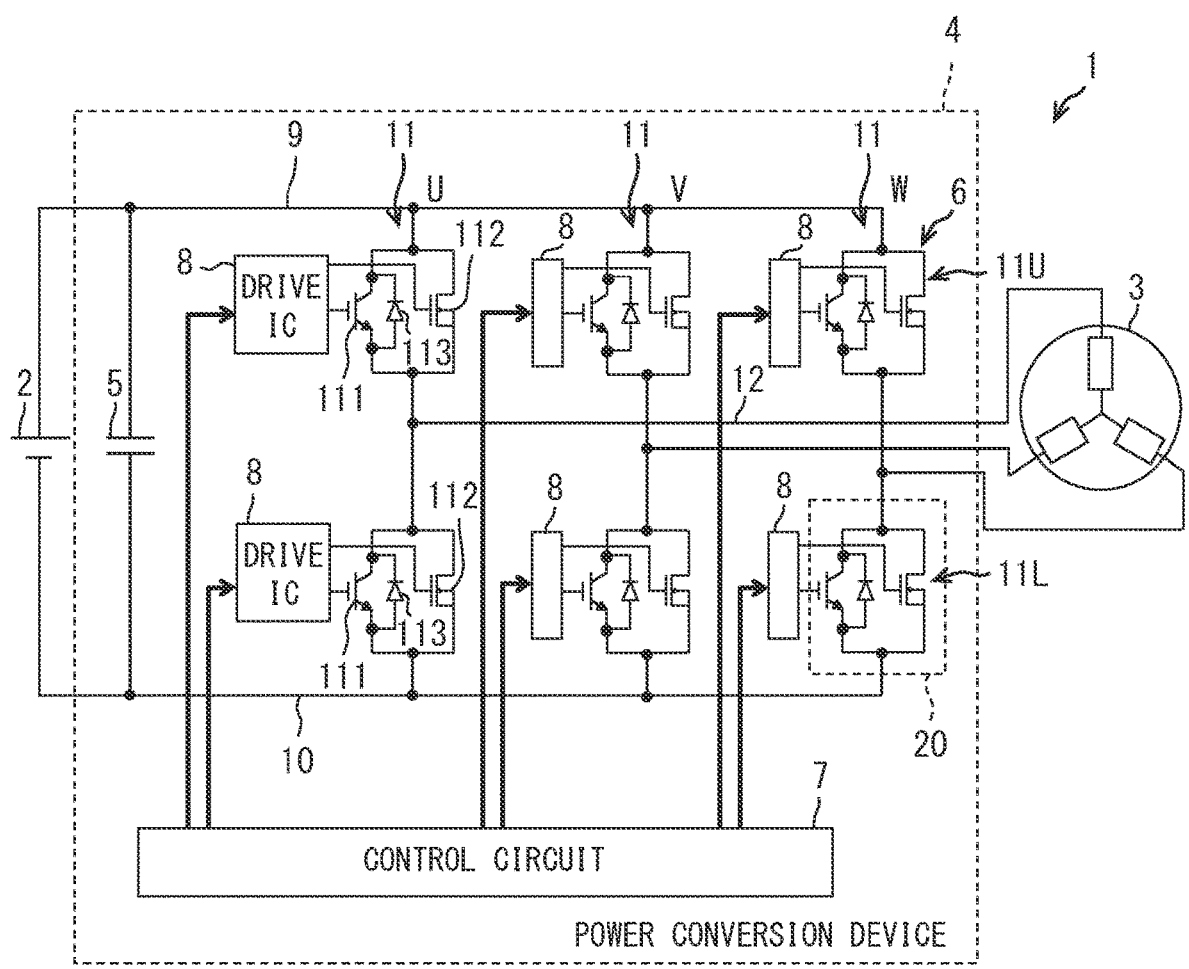
FIG. 1 is a diagram showing a circuit configuration of a power conversion device to which a semiconductor device according to a first embodiment is applied.
Figure 2:
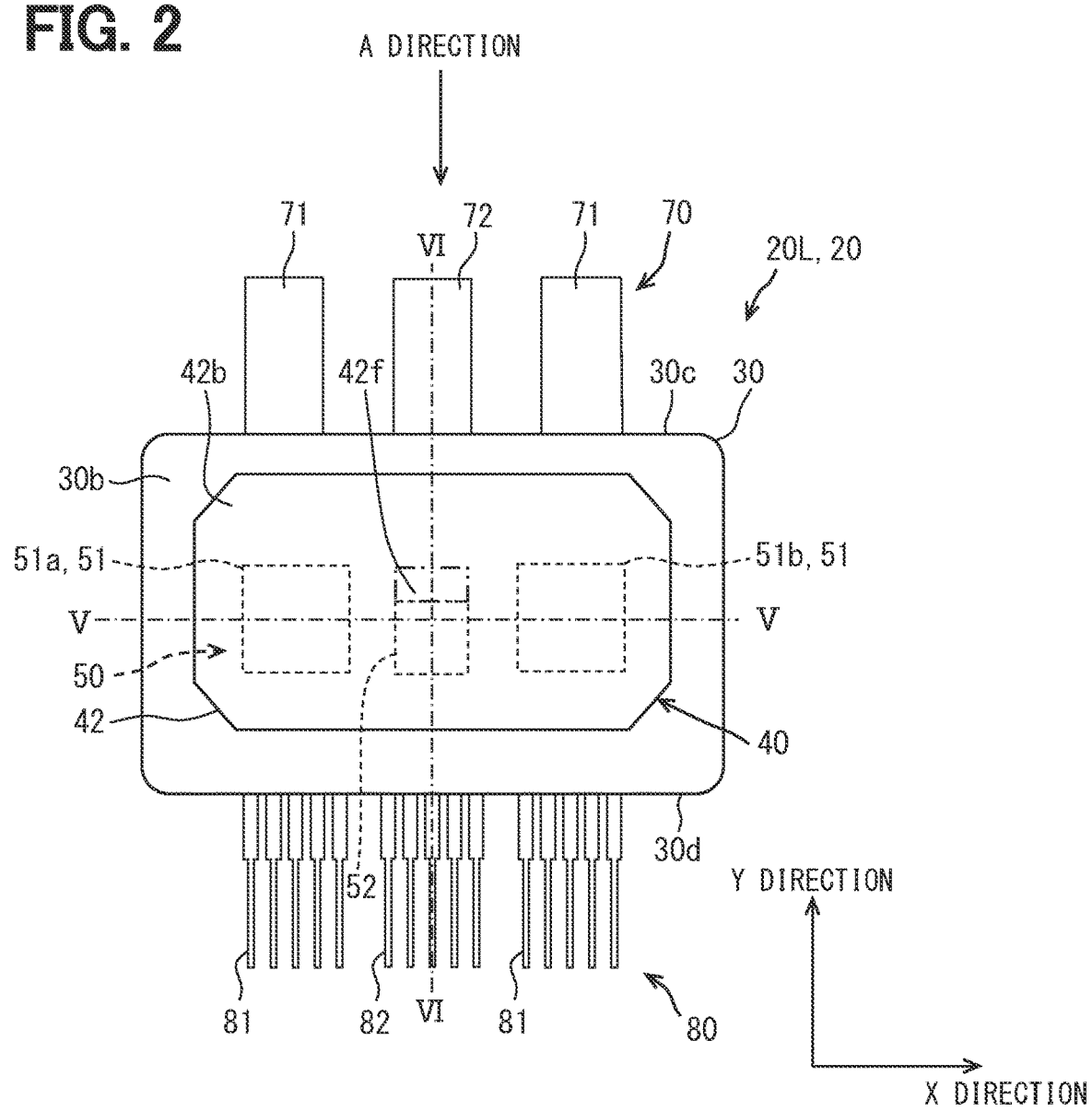
FIG. 2 is a plan view showing a semiconductor device of a lower arm.
Figure 3:
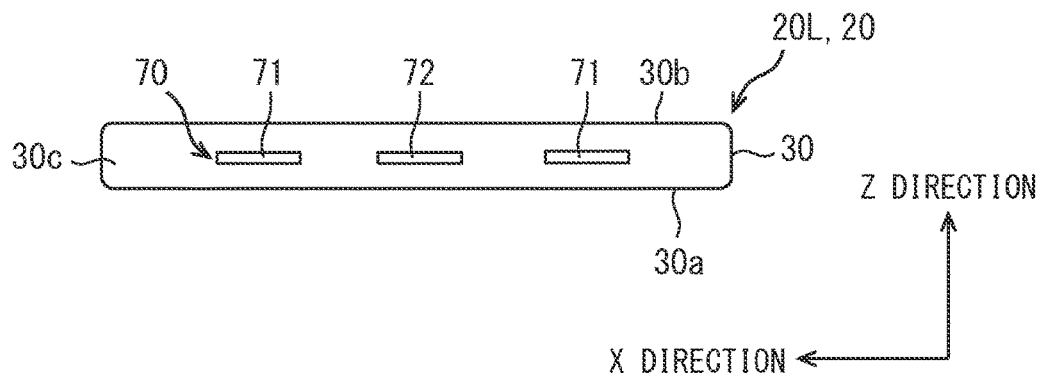
FIG. 3 is a plan view of FIG. 2 as seen from an A direction.

A semiconductor device according to an example includes a first switching element formed on a Si substrate and a second switching element formed on a SiC substrate. The first switching element and the second switching element are connected to a heat sink (heat dissipation member) and connected in parallel to each other. The substrate of the second switching element has an area smaller than the substrate of the first switching element.

In order to improve the output, a configuration including at least one of the first switching element or the second switching element in a plural number can be considered. The number of signal terminals increases with increase in the number of the switching elements. The increase in signal terminals affects, for example, the physical size, manufacturing time, cost, yield, and the like of the semiconductor device.

A semiconductor device according to one aspect of the present disclosure is a semiconductor device cooled by a refrigerant, and includes a heat dissipation member, multiple switching elements, and multiple signal terminals. Each of the switching elements includes a main electrode through which a main current flows and multiple pads. The main electrode in each of the switching elements is electrically connected to the heat dissipation member and the switching elements are connected in parallel with each other. The switching elements include a first switching element formed on a Si substrate and a second switching element formed on a SiC substrate. The signal terminals are electrically connected to the pads.

Each of the switching elements includes, as one of the pads, a temperature sense pad for detecting a substrate temperature. The switching elements include at least one of the first switching element or the second switching element in a plural number. The first switching element and the second switching element are alternately arranged in a predetermined direction in which the refrigerant flows. In the switching elements formed on a substrate of same type as the switching element disposed on a most downstream side, the signal terminal corresponding to the temperature sense pad is provided for a part of the switching elements including the switching element disposed on the most downstream side, and is not provided for a remaining part of the switching elements disposed on more upstream side than the part of the switching elements.

Since the semiconductor device described above include at least one of the first switching element or the second switching element in the plural number, the output of the semiconductor device can be improved. Due to the alternating arrangement, the semiconductor device includes multiple switching elements of the same type as the switching element disposed on the most downstream side. For example, when the switching element disposed on the most downstream side is the first switching element, the semiconductor device includes two or more first switching elements. When the switching element disposed on the most downstream side is the second switching element, the semiconductor device includes two or more second switching elements.

For example, the substrate temperature is detected via the temperature sense pad and the corresponding signal terminal for overheating monitoring of the switching element. Since the temperature of the refrigerant rises due to heat exchange with the switching element, the temperature of the refrigerant is lower toward the upstream side and higher toward the downstream side. Therefore, overheating monitoring of all switching elements of the same type is possible based on the substrate temperature of a part of the switching elements including at least the switching element disposed on the most downstream side. Further, since the signal terminal corresponding to the temperature sense pad is not provided for the switching element on the more upstream side than the part, the total number of signal terminals can be reduced. As a result, it is possible to provide a semiconductor device capable of reducing the number of signal terminals while improving the output.

Hereinafter, multiple embodiments will be described with reference to the drawings. In the multiple embodiments, functionally and/or structurally corresponding portions are designated with the same reference numerals. The power conversion device shown below is applicable to vehicles, such as an electric vehicle (EV) and a hybrid vehicle (HV), for example.

First Embodiment

First, a schematic configuration of a vehicle drive system to which a power conversion device is applied will be described with reference to FIG. 1.

As shown in FIG. 1, a vehicle drive system 1 is provided with a direct current (DC) power supply 2, a motor generator 3, and an electric power conversion device 4.

The DC power supply 2 is a direct-current voltage source including a chargeable/dischargeable secondary battery. Examples of the secondary battery include a lithium ion battery and a nickel hydrogen battery. The motor generator 3 is a three-phase alternating current (AC) type rotating electric machine. The motor generator 3 functions as a vehicle driving power source, that is, an electric motor. The motor generator 3 functions also as a generator during regeneration. The electric power conversion device 4 performs electric power conversion between the DC power supply 2 and the motor generator 3.

Next, a circuit configuration of the power conversion device 4 will be described with reference to FIG. 1. The power conversion device 4 includes at least a power conversion unit. The power conversion device 4 of the present embodiment includes a smoothing capacitor 5, an inverter 6 which is a power conversion unit, a control circuit 7, and a drive IC 8.

The smoothing capacitor 5 is connected between a P line 9 which is a power line on a high potential side and an N line 10 which is a power line on a low potential side. The P line 9 is connected to a positive electrode of the DC power supply 2, and the N line 10 is connected to a negative electrode of the DC power supply 2. The smoothing capacitor 5 mainly smooths the DC voltage supplied from the DC power supply 2.

The inverter 6 is a DC-AC converter. The inverter 6 includes upper-lower arm circuits 11 for three phases. A connection point of the upper-lower arm circuit 11 of a U phase is connected to a U phase winding provided at a stator of a motor generator 3. Similarly, a connection point of the upper-lower arm circuit 11 of a V phase is connected to a V phase winding of the motor generator 3. A connection point of the upper-lower arm circuit 11 of a W phase is connected to a W phase winding of the motor generator 3. The connection point of each upper and lower arm circuit 11 is connected to the corresponding phase winding via an output line 12. The output line 12, the P line 9 and the N line 10 described above are composed of, for example, a bus bar.

Each of the upper and lower arm circuits 11 has an upper arm 11U and a lower arm 11L. The upper arm 11U and the lower arm 11L are connected in series between the P line 9 and the N line 10 with the upper arm 11U connected adjacent to the P line 9. Each arm has an insulated gate bipolar transistor (IGBT) 111, a metal-oxide silicon field-effect transistor (MOSFET) 112, and a diode 113. The IGBT 111 and the MOSFET 112 are connected in parallel to each other. In the present embodiment, the IGBT 111 and the MOSFET 112 are n-channel type, for example. The diode 113 is connected to the IGBT 111 in antiparallel for return current. The MOSFET 112 has a parasitic diode (not shown).

In one arm, a collector electrode of the IGBT 111 and a drain electrode of the MOSFET 112 are connected to each other, and an emitter electrode of the IGBT 111 and a source electrode of the MOSFET 112 are connected to each other. An anode electrode of the diode 113 is connected to the emitter electrode, and a cathode electrode is connected to the collector electrode.

In the upper arm 11U, the collector electrode and the drain electrode are connected to the P line 9. In the lower arm 11L, the emitter electrode and the source electrode are connected to the N line 10. The emitter electrode and source electrode of the upper arm 11U and the collector electrode and drain electrode of the lower arm 11L are connected to each other. A semiconductor device 20 described later constitutes one arm. Each of the upper and lower arm circuits 11 includes the two semiconductor devices 20, and the inverter 6 includes the six semiconductor devices 20.

The inverter 6 converts the DC voltage into a three-phase AC voltage according to the switching control by the control circuit 7 and outputs the three-phase AC voltage to the motor generator 3. Thereby, the motor generator 3 is driven to generate a predetermined torque. At the time of regenerative braking of the vehicle, the inverter 6 converts the three-phase AC voltage generated by the motor generator 3 by receiving the rotational force from wheels into a DC voltage according to the switching control by the control circuit 7, and outputs the DC voltage to the P line 9. In this way, the inverter 6 performs bidirectional power conversion between the DC power supply 2 and the motor generator 3.

The control circuit 7 generates a drive command for operating the IGBT 111 and the MOSFET 112, and outputs the drive command to the drive IC 8. The control circuit 7 generates the drive command based on a torque request input from a higher-level ECU (not shown) or signals detected by various sensors. Various sensors include, for example, a current sensor, a rotation angle sensor, and a voltage sensor. The current sensor detects the phase current flowing through the winding of each phase. The rotation angle sensor detects the rotation angle of the rotor of the motor generator 3. The voltage sensor detects the voltage across the smoothing capacitor 5. The power conversion device 4 includes these sensors (not shown). The control circuit 7 outputs a PWM signal as the drive command. The control circuit 7 includes, for example, a microcomputer. ECU is an abbreviation for Electronic Control Unit. PWM is an abbreviation for Pulse Width Modulation.

The drive IC 8 generates a gate drive signal based on the drive command of the control circuit 7. The drive IC 8 outputs the generated gate drive signal to the IGBT 111 and the MOSFET 112 of the corresponding arm. The gate electrodes of the IGBT 111 and the MOSFET 112 included in one arm are electrically connected to the same drive IC8.

The drive IC 8 drives, that is, turns on or off the IGBT 111 and the MOSFET 112 by the gate drive signal. The drive IC 8 outputs the gate drive signal having a predetermined duty ratio. The drive IC 8 is also referred to as a driver. In the present embodiment, one drive IC 8 is provided for one arm. One drive IC 8 may be provided for one upper and lower arm circuit 11. The drive IC 8 may be provided integrally with the control circuit 7.

The power conversion device 4 may further include another converter as a power conversion unit. The converter is a DC-DC converter that converts a DC voltage into another DC voltage having a different value. The converter is provided between the DC power supply 2 and the smoothing capacitor 5. The converter is configured to include, for example, a reactor and the above-described upper and lower arm circuit 11. In this case, the upper and lower arm circuit 11 of the converter can also include the two semiconductor devices 20. Further, a filter capacitor for removing power supply noise from the DC power supply 2 may be provided. The filter capacitor is provided between the DC power supply 2 and the converter.

Next, the semiconductor devices 20 included in the upper and lower arm circuits 11 will be described with reference to FIG. 2 to FIG. 7. As shown in FIG. 2 to FIG. 7, each of the semiconductor devices 20 includes a sealing resin body 30, multiple heat dissipation members 40, multiple switching elements 50, multiple terminals 60, multiple main terminals 70, and multiple signal terminals 80.

In the following, a thickness direction of the switching elements 50 is referred to as a Z direction. A direction in which the switching elements 50 are arranged and orthogonal to the Z direction is indicated as an X direction. A direction orthogonal to the Z direction and the X direction is referred to as a Y direction. Unless otherwise specified, a shape along an XY plane, in other words, a shape viewed in a plane from the Z direction is simply referred to as a plane shape.

Figure 4:
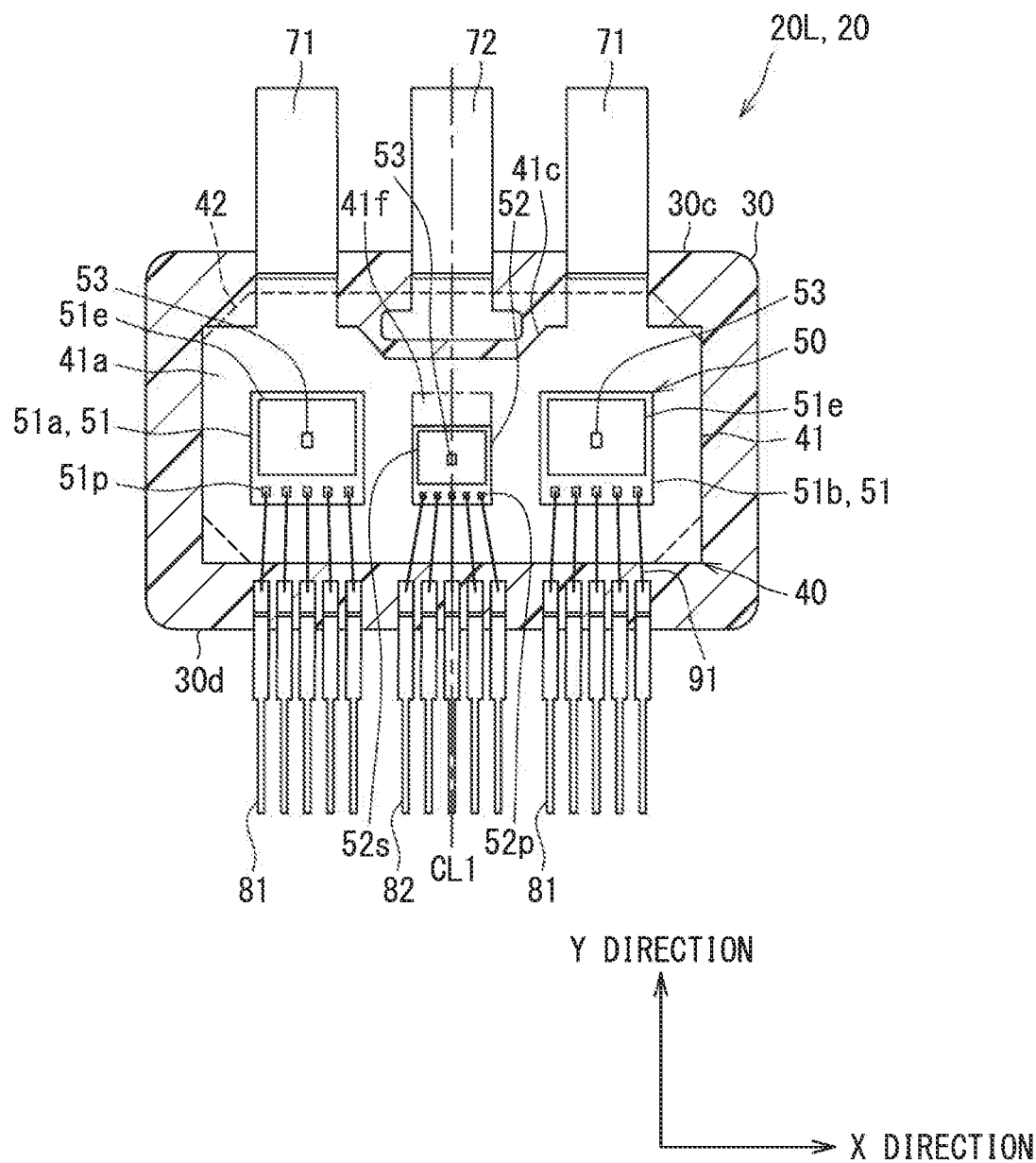
FIG. 4 is a partial cross-sectional view showing a structure inside a sealing resin body.
Figure 5:
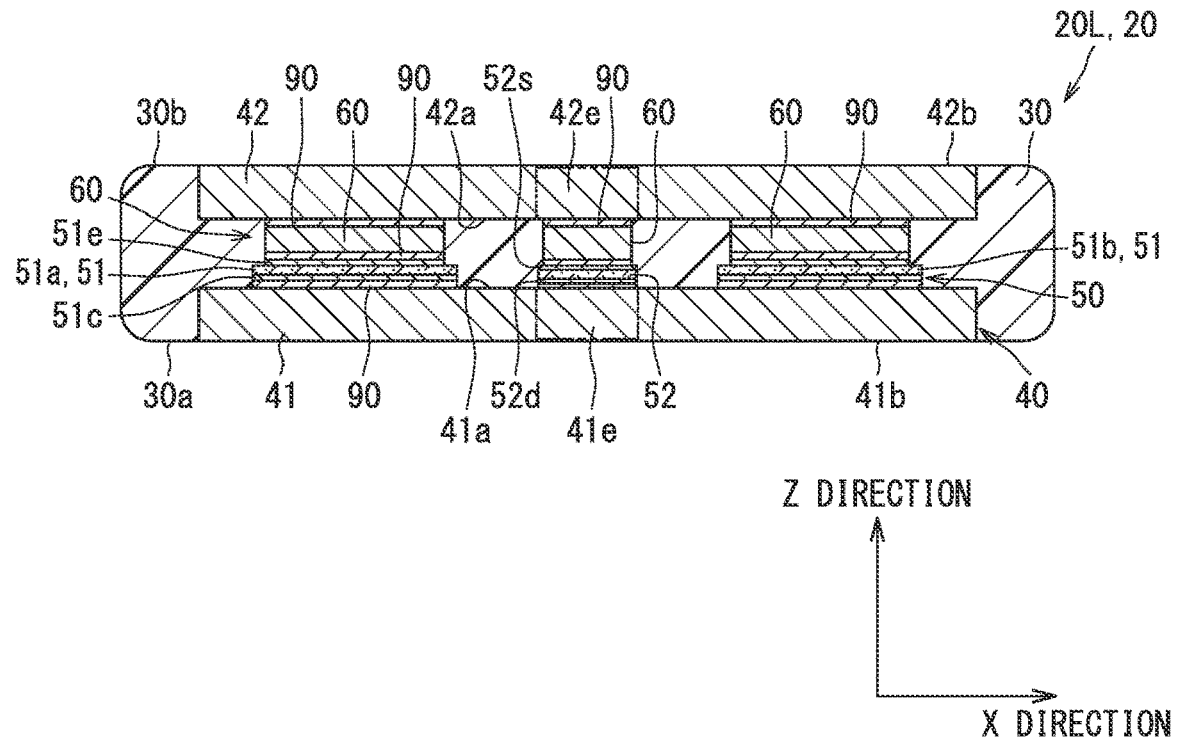
FIG. 5 is a cross-sectional view of the semiconductor device taken along a line V-V in FIG. 2.
Figure 6:
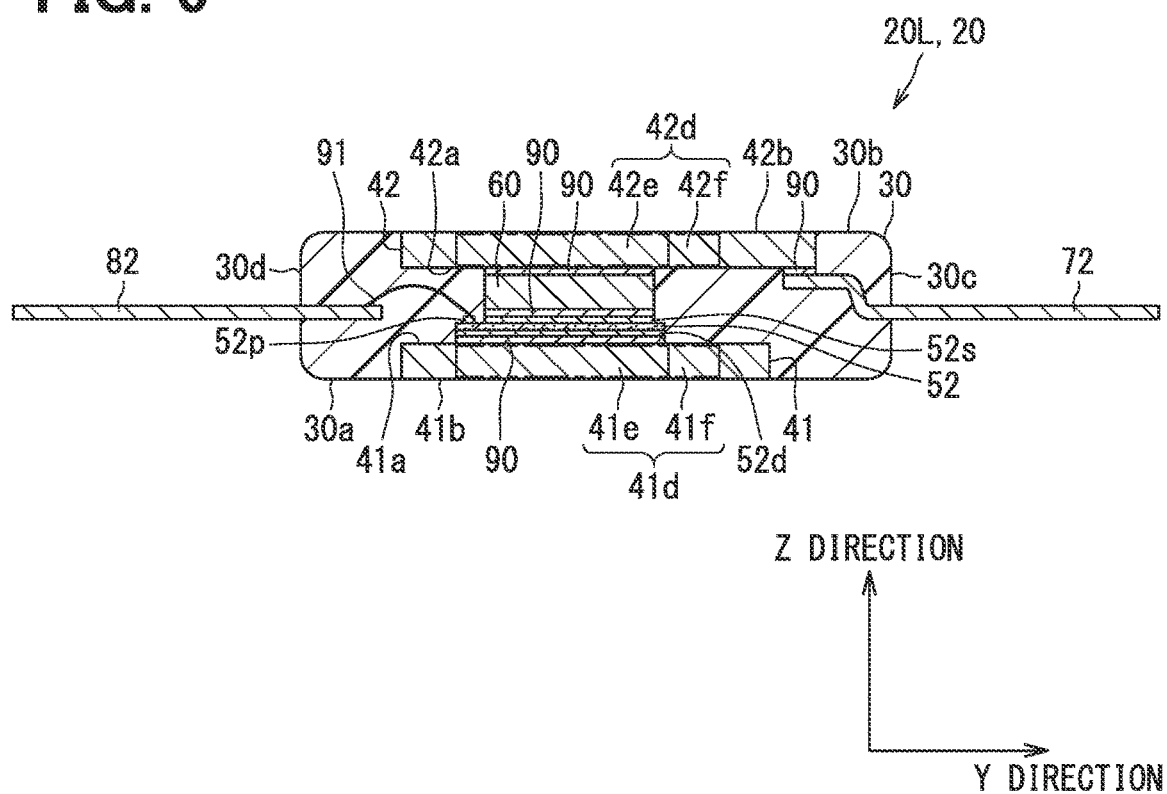
FIG. 6 is a cross-sectional view of the semiconductor device taken along a line VI-VI in FIG. 2.
Figure 7:
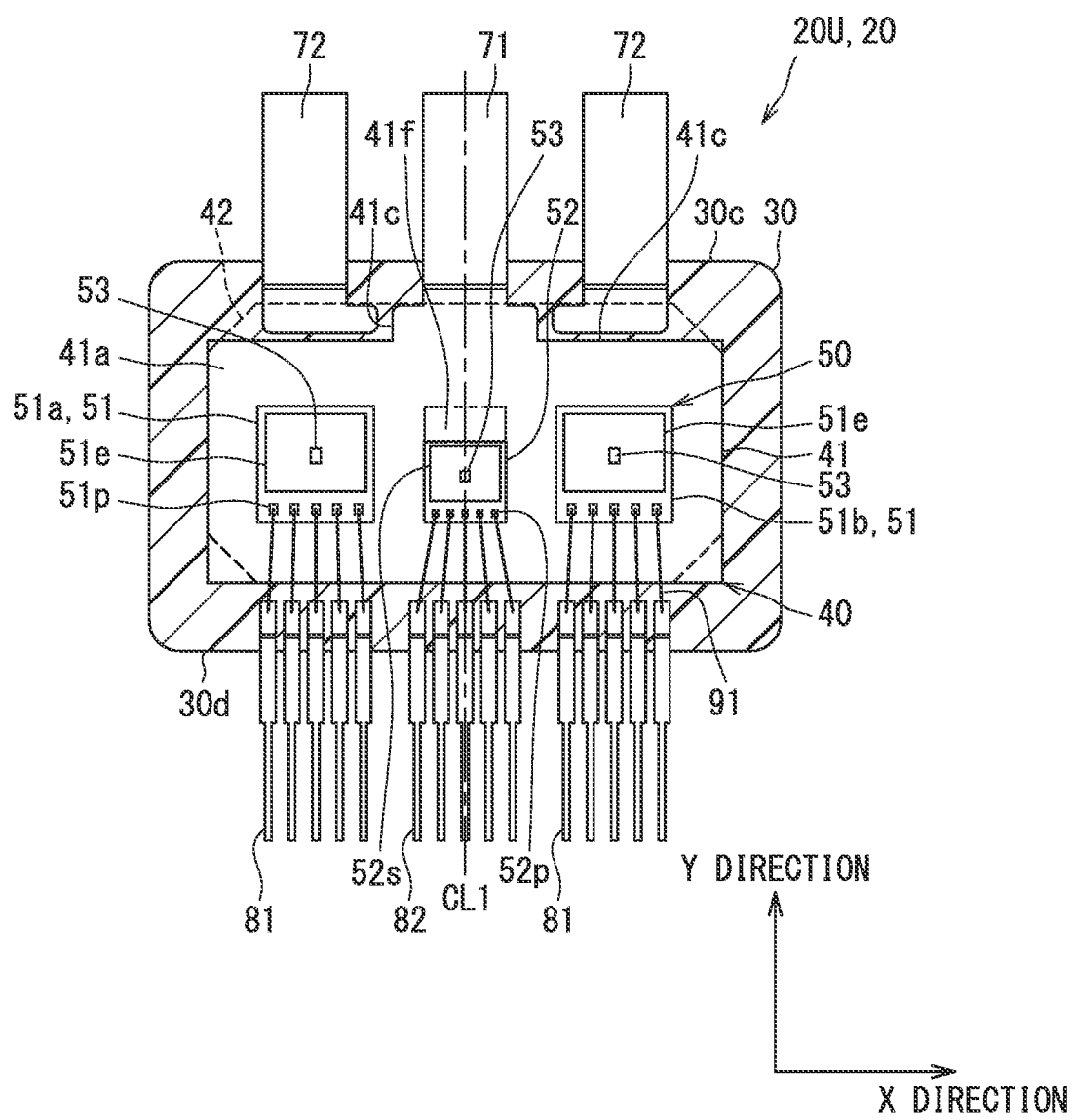
FIG. 7 is a diagram showing a semiconductor device of an upper arm.

The upper and lower arm circuits 11 includes the two semiconductor devices 20. In the present embodiment, the semiconductor device 20L included in the lower arm 11L and the semiconductor device 20U included in the upper arm 11U are divided. FIG. 2 to FIG. 6 show the semiconductor device 20L, and FIG. 7 shows the semiconductor device 20U. FIG. 4 and FIG. 7 are partial cross-sectional views showing the structure inside the sealing resin body 30 of each of the semiconductor devices 20L and 20U. In FIG. 4 and FIG. 7, a second heat dissipation member 42 is shown by a broken line.

The appearances of the semiconductor devices 20L and 20U are substantially the same. The semiconductor devices 20L and 20U have substantially the same configuration except for the arrangement order of the main terminals 70 and the electrical connection structure between the main terminals 70 and the heat dissipation members 40. In the following, unless otherwise specified, the semiconductor devices 20L and 20U have a common structure.

The sealing resin body 30 seals other elements included in the semiconductor device 20, for example, the switching elements 50. The sealing resin body 30 is made of, for example, an epoxy resin. The sealing resin body 30 is formed by, for example, a transfer molding method. The sealing resin body 30 may be referred to as a mold resin. The sealing resin body 30 has a first surface 30a and a second surface 30b opposite to the first surface 30a in the Z direction. The first surface 30a and the second surface 30b are, for example, flat surfaces. The sealing resin body 30 has a side surface connecting the first surface 30a and the second surface 30b.

In the present embodiment, the sealing resin body 30 has a substantially rectangular shape in a plan view. The sealing resin body 30 has side surfaces 30c and 30d. The side surface 30d is a surface opposite to the side surface 30c in the Y direction. The main terminals 70 project from the side surface 30c. The signal terminals 80 project from the side surface 30d.

The heat dissipation members 40 dissipate the heat generated by the switching element 50. The heat dissipation members 40 function as wirings that electrically relays the switching elements 50 and the main terminals 70. The heat dissipation members 40 are formed by using at least a metal material (for example, Cu) having excellent electrical conductivity and thermal conductivity. The heat dissipation members 40 are, for example, metal plates. Instead of the metal plate, a composite material of an electric insulator such as resin or ceramics and a metal body can be adopted. The heat dissipation member 40 is arranged on at least one side in the Z direction with respect to the switching elements 50. The switching elements 50 connected in parallel with each other are electrically connected to one surface of the heat dissipation member 40.

In the present embodiment, the heat dissipation members 40 are provided in pairs so as to sandwich the switching elements 50. The heat dissipation members 40 include a first heat dissipation member 41 arranged adjacent to the first surface 30a and the second heat dissipation member 42 arranged adjacent to the second surface 30b. In the following, the first heat dissipation member 41 and the second heat dissipation member 42 may be simply referred to as heat dissipation members 41 and 42. As the heat dissipation members 41 and 42, members of the same type may be used, or members different from each other may be used. In the present embodiment, members of the same type, specifically, metal plates containing Cu are used as the heat dissipation members 41 and 42.

The heat dissipation members 41 and 42 are provided so as to cover the switching elements 50 in a plan view from the Z direction. The heat dissipation members 41 and 42 cover the switching elements 50 in a region facing each other. The heat dissipation members 41 and 42 have mounting surfaces 41a and 42a adjacent to the switching elements 50 and heat dissipation surfaces 41b and 42b opposite to the mounting surfaces 41a and 42a in the Z direction, respectively. The mounting surfaces 41a and 42a face each other in the Z direction. The mounting surfaces 41a and 42a are substantially parallel to each other. The heat dissipation members 41 and 42 have thickness directions substantially parallel to the Z direction. The heat dissipation members 41 and 42 have longitudinal directions in the X direction. At least a part of each of the heat dissipation members 41 and 42 is sealed by the sealing resin body 30.

Each of the switching elements 50 is formed by forming an element included in the above-described arm on a semiconductor substrate. The switching elements 50 may be referred to as semiconductor elements or semiconductor chips. The switching elements 50 are electrically connected to the heat dissipation members 40 and connected in parallel to each other.

Each of the switching elements 50 has a vertical structure in which main electrodes are provided on both sides in the Z direction, and a main current flows in the Z direction. The switching elements 50 include a first switching element 51 and a second switching element 52. The first switching element 51 is formed on a silicon (Si) substrate. The second switching element 52 is formed on a silicon carbide (SiC) substrate. In the following, the first switching element 51 and the second switching element 52 may be simply referred to as switching elements 51 and 52. The first switching element 51 includes an IGBT 111. In the present embodiment, a diode 113 is integrally formed with the IGBT 111. That is, a reverse conducting (RC) IGBT is formed in the first switching elements 51. The second switching element 52 includes a MOSFET 112.

The first switching element 51 has a first surface and a second surface opposite to each other. The first switching element 51 has, as main electrodes, a collector electrode 51c formed on the first surface and an emitter electrode 51e formed on the second surface. The collector electrode 51c serves as a cathode electrode of the diode 113, and the emitter electrode 51e serves as an anode electrode of the diode 113. The collector electrode 51c is formed on almost the entire surface of the first surface, and the emitter electrode 51e is formed on a part of the second surface. The second switching element 52 has a first surface and a second surface opposite to each other. The second switching element 52 has, as main electrodes, a drain electrode 52d formed on the first surface and a source electrode 52s formed on the second surface. The drain electrode 52d is formed on almost the entire surface of the first surface, and the source electrode 52s is formed on a part of the second surface.

In a semiconductor substrate, a formation region in which an element is formed is an active region that generates heat when supplied with electric current. A high breakdown voltage structure (for example, a guard ring), which is not shown, is formed in an outer peripheral region surrounding the active region. In a plan view from the Z direction, the emitter electrode 51e and the source electrode 52s, which are the main electrodes on the low potential side, substantially match the active region.

Each of the switching elements 50 has a temperature sensor 53 on the second surface of the semiconductor substrate. The temperature sensor 53 detects the substrate temperature (element temperature) for overheat protection. Since the substrate temperature rises with decrease in the distance to the center of the active region, the temperature sensor 53 is provided near the center of the active region in a plan view from the Z direction. In the present embodiment, a temperature sensitive diode is used as the temperature sensor 53. The temperature sensitive diode is formed, for example, by doping polysilicon arranged on a semiconductor substrate with impurities. A detection signal of the temperature sensor 53 is used to control the switching element 50. Specifically, the switching element 50 is forcibly turned off before the switching element 50 becomes overheated. The temperature sensitive diode can also be built in the semiconductor substrate.

The first switching element 51 has pads 51p in addition to the main electrodes. The pads 51p are electrode for signals. The pads 51p are formed on the same surface as the emitter electrode 51e. The pads 51p are formed at an end portion on the side opposite to the formation region of the emitter electrode 51e in the Y direction. The second switching element 52 has pads 52p. The pads 52p are formed on the same surface as the source electrode 52s. The pads 52p are formed at an end portion opposite to a formation region of the source electrode 52s in the Y-direction. In the Y direction, the emitter electrode 51e and the source electrode 52s are disposed adjacent to the main terminals 70, and the pads 51p and 52p are disposed adjacent to the signal terminals 80.

In the present embodiment, the collector electrode 51c is formed on the first surface adjacent to the first heat dissipation member 41, and the emitter electrode 51e is formed on the second surface adjacent to the second heat dissipation member 42. The drain electrode 52d is formed on the first surface adjacent to the first heat dissipation member 41, and the source electrode 52s is formed on the second surface adjacent to the second heat dissipation member 42. The collector electrode 51c and the drain electrode 52d, which are the main electrodes on the high potential side, are connected to the mounting surface 41a of the first heat dissipation member 41 via a bonding member 90. The emitter electrode 51e and the source electrode 52s, which are the main electrodes on the low potential side, are connected to the mounting surface 42a of the second heat dissipation member 42 via bonding members 90 and the terminals 60. As the bonding member 90, a conductive paste containing solder, Ag, or the like can be used. In the present embodiment, the bonding member 90 is solder, for example.

The first switching element 51 has five pads 51p. Specifically, the first switching element 51 has a pad 51p for the gate electrode, a pad 51p for potential detection of the emitter electrode 51e, a pad 51p for sensing current, a pad 51p for an anode potential of the temperature sensor 53, and a pad 51p for a cathode potential of the temperature sensor 53. The pads 51p are provided side by side in the X direction. Similarly, the second switching element 52 has five pads 52p. Specifically, the second switching elements 52 has a pad 52p for the gate electrode, a pad 52p for potential detection of the source electrode 52s, a pad 52p for sensing current, a pad 52p for an anode potential of the temperature sensor 53, and a pad 52p for a cathode potential of the temperature sensor 53. The pads 52p are provided side by side in the X direction.

The switching elements 50 include at least one of the first switching element 51 or the second switching element 52 in a plural number. In other words, the switching elements 50 include multiple first switching elements 51 and one second switching element 52, one first switching element 51 and multiple second switching elements 52, or multiple first switching elements 51 and multiple second switching elements 52. The first switching element 51 and the second switching element 52 are arranged alternately in the X direction, which is the arrangement direction of the switching elements 50. The term "alternately" means that the first switching element 51 and the second switching element 52 are next to each other in the arrangement direction. An example of the minimum configuration of alternate arrangement is a combination of two first switching elements 51 and one second switching element 52. Another example is a combination of one first switching element 51 and two second switching elements 52.

The switching elements 50 of the present embodiment includes two first switching elements 51 and one second switching element 52. The two first switching elements 51 have the same configuration as each other. In the following, one of the first switching elements 51 may be referred to as a first switching element 51a, and the other one may be referred to as a first switching element 51b. The three switching elements 50 are arranged in the order of the first switching element 51a, the second switching element 52, and the first switching element 51b in the X direction. The second switching element 52 is arranged between the first switching elements 51a and 51b. The first switching elements 51a and 51b are connected in parallel to each other. Since the elements formed in the first switching elements 51a and 51b have circuits equivalent to each other, one IGBT 111 and one diode 113 are shown in FIG. 1.

The terminals 60 are interposed between the second heat dissipation member 42 and the switching elements 50 in order to secure a predetermined distance between the second heat dissipation member 42 and the switching elements 50. The thickness of the terminals 60 is sufficiently thicker than the thickness of the switching elements 50. The terminals 60 function to transfer heat from the switching elements 50 to the second heat dissipation member 42. The terminals 60 function as wirings that electrically relay the switching elements 50 and the second heat dissipation member 42. The terminals 60 are formed by using a metal material such as Cu. The terminals 60 may have either a single-layer structure made of one kind of metal or a multi-layer structure made of multiple kinds of metals. The terminals 60 are provided separately to the first switching elements 51 and the second switching element 52.

In the present embodiment, one terminal 60 is provided for one switching element 50. The terminals 60 function as spacers that secure a predetermined distance between the second heat dissipation member 42 and the switching elements 50. The spacer can prevent bonding wires 91 from coming into contact with the second heat dissipation member 42. Each of the terminals 60 has a substantially rectangular parallelepiped shape. The planar shape of the terminals 60 is almost the same as the main electrode to be connected. In the Z direction, one of end faces of the terminal 60 is connected to the main electrode of one of the switching elements 50, and the other one of the end faces is connected to the second heat dissipation member 42. The terminals 60 are connected to the corresponding main electrodes 51e and 52s and the second heat dissipation member 42 via the bonding members 90.

The main terminals 70 are terminals via which the main current flows among external connection terminals for electrically connecting the semiconductor device 20 and an external device. The main terminals 70 are electrically connected to the corresponding main electrodes. The main terminals 70 include a high potential terminal 71 and a low potential terminal 72. The high potential terminal 71 is electrically connected to the collector electrode 51c and the drain electrode 52d, which are the main electrodes on the high potential side. The high potential terminal 71 may be referred to as a collector terminal or a drain terminal. The low potential terminal 72 is electrically connected to the emitter electrode 51e and the source electrode 52s, which are the main electrodes on the low potential side. The low potential terminal 72 may be referred to as an emitter terminal or a source terminal. In the following, the high potential terminal 71 and the low potential terminal 72 may be simply referred to as main terminals 71 and 72.

The main terminals 70 are connected to the corresponding main electrodes via the heat dissipation members 40. The high potential terminal 71 is connected to the first heat dissipation member 41. The low potential terminal 72 is connected to the second heat dissipation member 42. As an example, the main terminals 70 may be integrally connected to the heat dissipation member 40, for example, as a part of a metal member (for example, a lead frame). As another example, the main terminal 70 may be provided as a member separated from the heat dissipation member 40, and connected to the heat dissipation member 40 by connection. The main terminals 70 are connected to the corresponding heat dissipation member 40 inside the sealing resin body 30. The main terminal 70 are connected to an end portion of the heat dissipation member 40 adjacent to the side surface 30c in the Y direction. All the main terminals 70 extend inside and outside the sealing resin body 30.

In the present embodiment, all the main terminals 70 extend in the Y direction from the corresponding heat dissipation member 40. All the main terminals 70 project outward from the side surface 30c of the sealing resin body 30. Both the main terminals 71 and 72 have a bent portion in the sealing resin body 30, and project from substantially the same position in the Z direction on the side surface 30c. In a part including the projecting portion, the main terminals 71 and 72 are arranged with a predetermined gap in the X direction so that side surfaces of the main terminals 71 and 72 face to each other. The main terminals 70 include one high potential terminal 71 and two low potential terminals 72, or one low potential terminal 72 and two high potential terminals 71. The main terminals 70 has multiple (two sets) side facing portions of the high potential terminal 71 and the low potential terminal 72. As shown in FIG. 4 and FIG. 7, the high potential terminal 71 is integrally connected to the first heat dissipation member 41. The low potential terminal 72 is connected to the second heat dissipation member 42 by connection. As shown in FIG. 6, for example, the low potential terminal 72 is connected to the mounting surface 42a of the second heat dissipation member 42 via the bonding member 90.

The semiconductor device 20L includes two high potential terminals 71 and one low potential terminal 72. The main terminals 71 and 72 are arranged side by side in the X direction. The low potential terminal 72 is arranged between the high potential terminals 71. As shown in FIG. 4, the first heat dissipation member 41 has a recess 41c on a side to which the high potential terminals 71 are connected. The recess 41c is recessed toward the side surface 30d. The recess 41c is provided in the central region of the first heat dissipation member 41 in the X direction. The high potential terminals 71 are connected to respective peripheral regions sandwiching the central region in the first heat dissipation member 41. The second heat dissipation member 42 includes a portion that overlaps with the recess 41c in a plan view in the Z direction as a non-facing region that does not face the first heat dissipation member 41. The low potential terminal 72 is connected to the non-facing region of the second heat dissipation member 42 that overlaps the recess 41c. Since the low potential terminal 72 is connected to the non-facing region, the low potential terminal 72 is easily connected to the second heat dissipation member 42.

The semiconductor device 20U includes one high potential terminal 71 and two low potential terminal 72. The main terminals 71 and 72 are arranged side by side in the X direction. The high potential terminal 71 is arranged between the low potential terminals 72. As shown in FIG. 7, the first heat dissipation member 41 of the semiconductor device 20U also has recesses 41c. The recesses 41c are provided in respective peripheral regions of the first heat dissipation member 41 in the X direction. The high potential terminal 71 is connected to the central region sandwiched between the peripheral regions in the first heat dissipation member 41. The low potential terminals 72 are connected to the non-facing regions of the second heat dissipation member 42 that overlap the recesses 41c.

The signal terminals 80 are electrically connected to the pads of the corresponding switching elements 50. The signal terminals 80 includes first signal terminals 81 and second signal terminals 82. The first signal terminals 81 are electrically connected to the pads 51p of the first switching elements 51. The second signal terminals 82 are electrically connected to the pads 52p of the second switching element 52.

The signal terminals 80 of the present embodiment are connected to the corresponding pads 51p and 52p via the bonding wires 91. The signal terminals 80 are connected to the bonding wires 91 inside the sealing resin body 30. Each of the signal terminals 80 extends in the Y direction and projects outward from the side surface 30d of the sealing resin body 30. The signal terminals 80 is a part of the lead frame including the main terminals 70 and the first heat dissipation member 41.

In the semiconductor device 20 configured as described above, at least a part of each of the heat dissipation members 40, the switching elements 50, the terminals 60, the main terminals 70, and a part of each of the signal terminals 80 are integrally sealed by the sealing resin body 30. In other words, the elements included in one arm are sealed. Therefore, the semiconductor device 20 is also referred to as "1-in-1 package".

As the semiconductor device 20, an example in which the semiconductor device 20U for the upper arm 11U and the semiconductor device 20L for the lower arm 11L are separately provided has been shown, but the present disclosure is not limited this example. The semiconductor device 20 may have a common structure between the upper arm 11U and the lower arm 11L. For example, the above-described semiconductor device 20L may be used not only for the lower arm 11L but also for the upper arm 11U. The semiconductor device 20U may be used not only for the upper arm 11U but also for the lower arm 11L. As a result, the number of parts can be reduced. Further, the structures may be exchanged between the semiconductor device 20L and the semiconductor device 20U. That is, the semiconductor device 20L may be used for the upper arm 11U, and the semiconductor device 20U may be used for the lower arm 11L.

Figure 8:
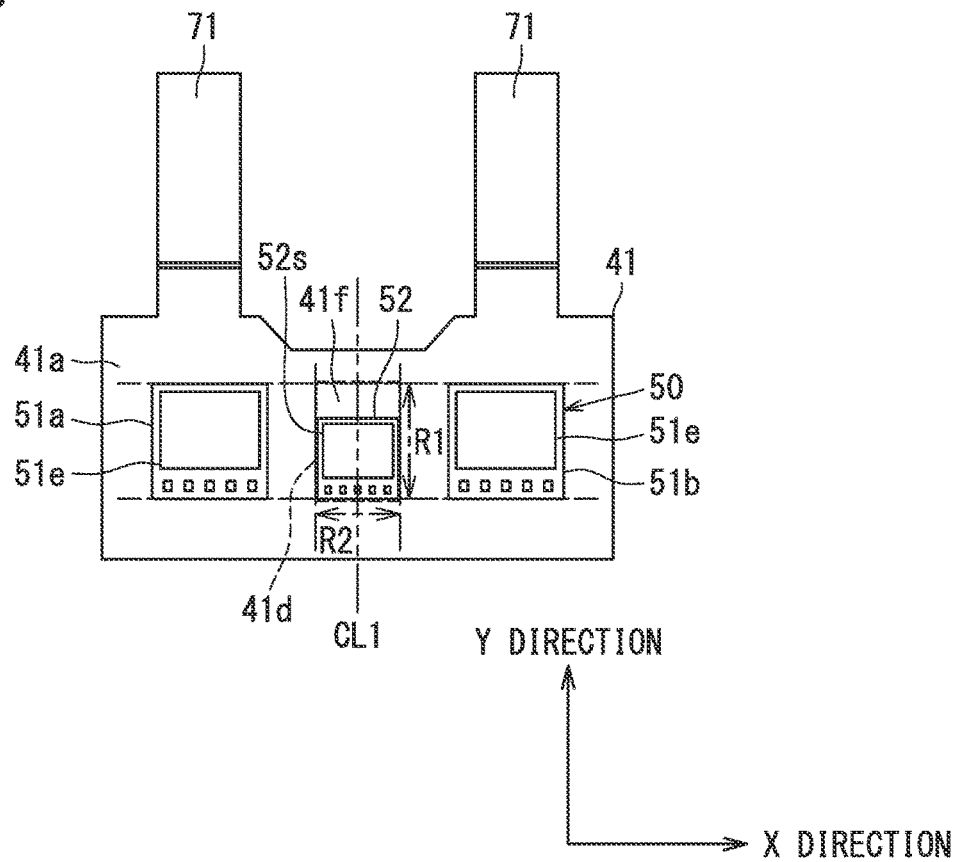
FIG. 8 is a diagram showing an arrangement of switching elements and a heat dissipation member.
Figure 9:
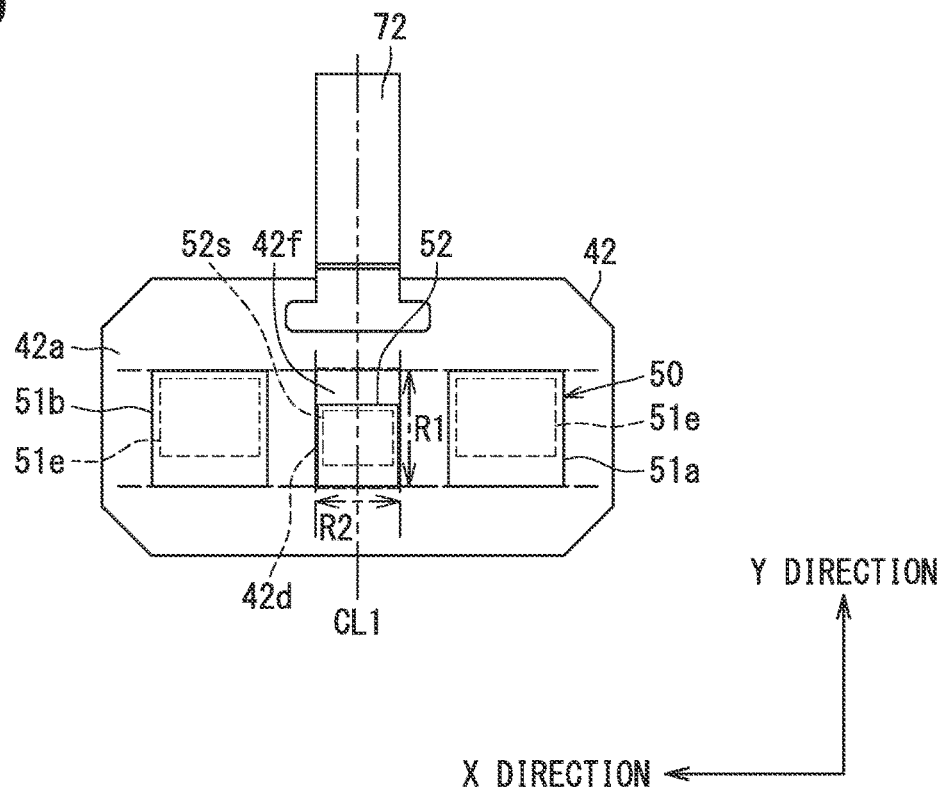
FIG. 9 is a diagram showing an arrangement of switching elements and a heat dissipation member.

Next, the details of the semiconductor device 20 will be described with reference to FIG. 4 to FIG. 9. FIG. 8 and FIG. 9 are schematic plan views showing the positional relationship between the switching elements 50 and the heat dissipation members 41 and 42. FIG. 8 and FIG. 9 also show the main terminals 71 and 72. Although FIG. 8 and FIG. 9 show the semiconductor device 20L, but the same applies to the semiconductor device 20U.

In the present embodiment, the substrate area of the second switching element 52 is smaller than the substrate area of each of the first switching elements 51. The substrate area is an area orthogonal to the Z direction, which is the thickness direction, that is, an area along the XY plane. The substrate area may be referred to as a chip area or an element area. When the substrate area is increased, the active area of the element also increases. When the SiC substrate is smaller than the Si substrate, the cost and the physical size can be reduced. Further, the thickness of the second switching element 52 is thinner than the thickness of the first switching elements 51. At the same withstand voltage, a drift layer of SiC can be thinner than a drift layer of Si.

The switching elements 50 are arranged in the central region in the Y direction on the mounting surface 41a. The positions of ends of the first switching elements 51 and the second switching element 52 adjacent to the signal terminals 80 are substantially the same in the Y direction. The positions of ends adjacent to the main terminals 70 are different between the first switching elements 51 and the second switching element 52.

FIG. 8 and FIG. 9 show a region R1 in which the first switching elements 51 are virtually extended in the X direction and a region R2 in which the second switching element 52 is virtually extended in the Y direction. The region R1 is defined by lines obtained by virtually extending, in the X direction, both ends of the first switching elements 51 in the Y direction. The region R2 is defined by lines obtained by virtually extending, in the Y direction, both ends of the second switching element 52 in the X direction. In FIG. 8 and FIG. 9, virtually extended lines are shown by long dashed short dashed lines.

As shown in FIG. 8, the first heat dissipation member 41 has an intersecting region 41d which is a region overlapping the intersecting portion between the regions R1 and the regions R2 in a plan view from the Z direction. In FIG. 8, the intersecting region 41d is shown by a dashed line. The intersecting region 41d includes an overlapping region 41e that overlaps with the second switching element 52 and a non-overlapping region 41f that does not overlap with the second switching element 52. The first heat dissipation member 41 has an overlapping region 41e and a non-overlapping region 41f in a facing region defined between two first switching elements 51a and 51b arranged in the X direction. In the first heat dissipation member 41, the overlapping region 41e is the mounting region of the second switching element 52, and the non-overlapping region 41f is the non-mounting region. In the Z direction, the overlapping region 41e is a region facing the second switching element 52, and the non-overlapping region 41f is the non-facing region.

As shown in FIG. 9, the second heat dissipation member 42 has an intersecting region 42d similarly to the first heat dissipation member 41. In FIG. 9, the intersecting region 42d is shown by a dashed line. The intersecting region 42d includes an overlapping region 42e that overlaps with the second switching element 52 and a non-overlapping region 42f that does not overlap with the second switching element 52. The second heat dissipation member 42 has an overlapping region 42e and a non-overlapping region 42f in a facing region defined between two first switching elements 51a and 51b arranged in the X direction. In the second heat dissipation member 42, the overlapping region 42e is a region facing the second switching element 52, and the non-overlapping region 42f is a region not facing the second switching element 52.

As shown in FIGS. 8 and 9, a part of the emitter electrodes 51e is arranged at the same position in the Y direction as a part of the source electrode 52s. A part of the emitter electrodes 51e is arranged at the same position in the Y direction as a part of the overlapping regions 41e and 42e. The other part of the emitter electrodes 51e is arranged at the same position in the Y direction as a part of the non-overlapping region 41f. That is, in the X direction, a part of the emitter electrodes 51e faces the source electrode 52s, and the other part of the emitter electrodes 51e faces the non-overlapping regions 41f and 42f.

As described above, the heat dissipation members 40 have non-overlapping regions 41f and 42f as a part of the intersecting regions 41d and 42d. Then, at least a part of the non-overlapping regions 41f and 42f is exposed from the sealing resin body 30. For example, at least a part of the non-overlapping region 41f may be exposed. Only a part of the non-overlapping region 42f may be exposed. Both the non-overlapping regions 41f and 42f may be exposed. When the non-overlapping region 41f is exposed, at least one of the mounting surface 41a or the heat dissipation surface 41b may be exposed. Similarly, when the non-overlapping region 42f is exposed, at least one of the mounting surface 42a and the heat dissipation surface 42b may be exposed.

In the present embodiment, the non-overlapping regions 41f and 42f are exposed. The entire surface of the non-overlapping region 41f adjacent to the heat dissipation surface 41b is exposed and the entire surface of the non-overlapping region 41f adjacent to the mounting surface 41a is covered. The entire surface of the non-overlapping region 42f adjacent to the heat dissipation surface 42b is exposed and the entire surface of the non-overlapping region 42f adjacent to the mounting surface 42a is covered. Further, the overlapping regions 41e and 42e are also exposed. The heat dissipation surfaces 41b and 42b are exposed in almost the entire area. The heat dissipation surface 41b is substantially flush with the first surface 30a of the sealing resin body 30. The heat dissipation surface 42b is substantially flush with the second surface 30b. The semiconductor device 20 has a double-sided heat dissipation structure in which both the heat dissipation surfaces 41b and 42b are exposed from the sealing resin body 30.

The virtual line CL1 shown in FIGS. 4 and 7 to 9 is a line extending in the Y direction through the element center of the second switching element 52. The elemental center is the center of the second switching element 52 (chip). The virtual line CL1 passes through the center of the active region.

In the present embodiment, the arrangement of the three switching elements 50 is line symmetric with respect to the virtual line CL1. As a result, the interval between the switching elements 51a and 52 and the interval between the switching elements 51b and 52 are substantially equal to each other. The non-overlapping regions 41e and 42e described above are disposed on the virtual line CL1.

The arrangement of the three terminals 60 is also line symmetric with respect to the virtual line CL1. Each of the first heat dissipation member 41 and the second heat dissipation member 42 is also line symmetric with respect to the virtual line CL1. In the semiconductor device 20L, the low potential terminal 72 is arranged on the virtual line CL1. The center of the width of the low potential terminal 72 is disposed on the virtual line CL1. As shown in FIG. 4, the arrangement of the three main terminals 70 is line symmetric with respect to the virtual line CL1. In the semiconductor device 20U, the high potential terminal 71 is arranged on the virtual line CL1. The center of the width of the high potential terminal 71 is disposed on the virtual line CL1. As shown in FIG. 7, the arrangement of the three main terminals 70 is line symmetric with respect to the virtual line CL1.

Figure 10:
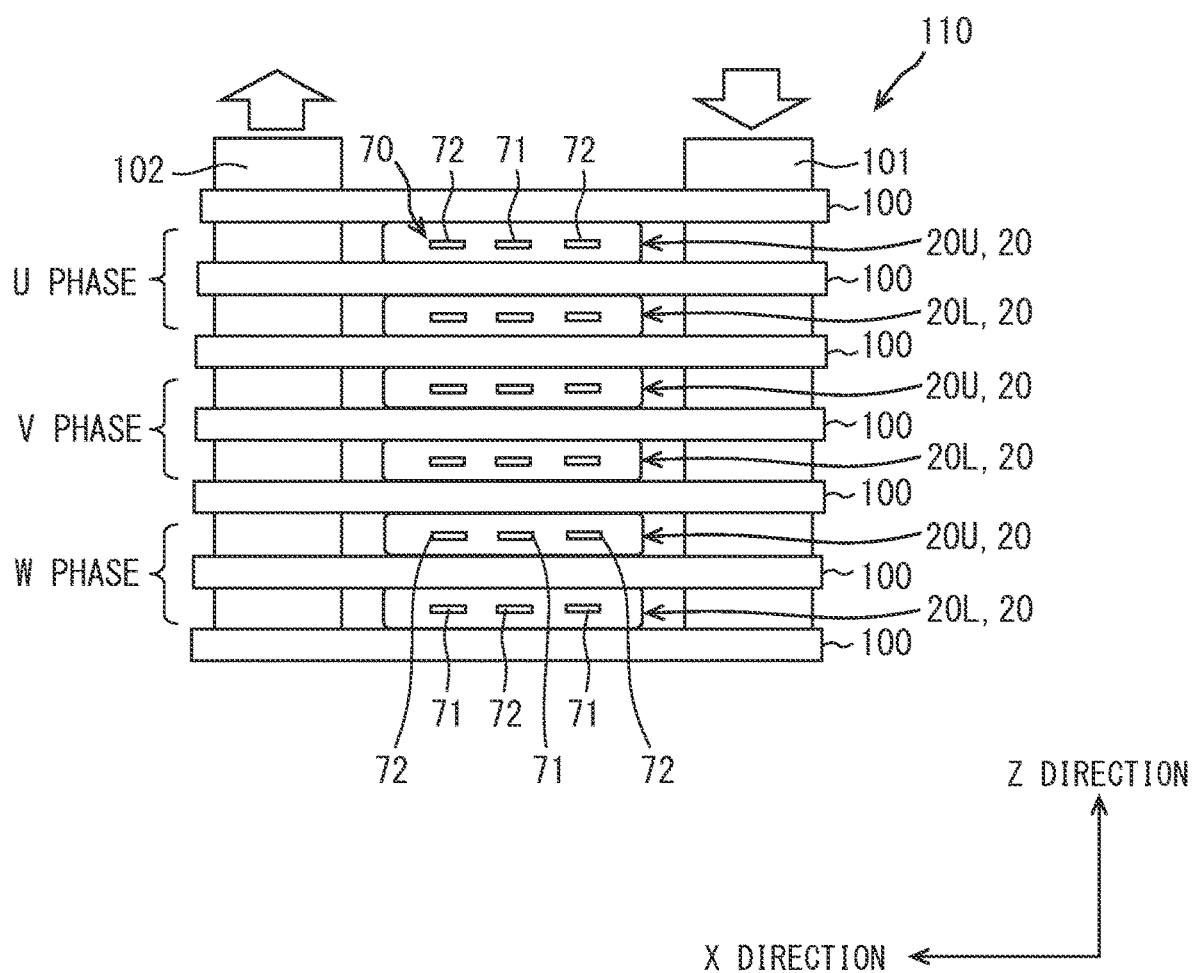
FIG. 10 is a plan view showing a laminated structure with coolers.

Next, a cooling structure of the semiconductor device 20 will be described with reference to FIG. 10. As shown in FIG. 10, the semiconductor devices 20 described above are alternately laminated with coolers 100. The semiconductor devices 20 form a power module 110 together with the coolers 100.

Each of the coolers 100 has a flow path for a refrigerant. The coolers 100 are arranged in multiple stages with a predetermined interval therebetween in the Z direction. The coolers 100 in multiple stages are connected by a supply pipe 101 on one end side in the X direction. The supply pipe 101 is a tubular body defining a flow path therein, and extends in the Z direction. The supply pipe 101 is connected to each of the coolers 100, and the flow path of the supply pipe 101 communicates with the flow path of each of the coolers 100.

The coolers 100 in multiple stages are connected by a discharge pipe 102 on the end side opposite to the supply pipe 101. The discharge pipe 102 is a tubular body defining a flow path therein, and extends in the Z direction. The discharge pipe 102 is connected to each of the coolers 100, and the flow path of the discharge pipe 102 communicates with the flow path of each of the coolers 100. The refrigerant that flows from the supply pipe 101 spreads in the flow path of each of the coolers 100 and is discharged from the discharge pipe 102.

As the refrigerant, a phase-changing refrigerant such as water or ammonia or a non-phase-changing refrigerant such as ethylene glycol can be used. The coolers 100 mainly cool the semiconductor devices 20. However, in addition to the cooling function, the coolers 100 may have a warming function when the environmental temperature is low. Then, the coolers 100 may be referred to as temperature adjusting instruments. The refrigerant is referred to as a heat medium.

The power module 110 includes the six semiconductor devices 20 included in the inverter 6 and the coolers 100 alternately stacked with the semiconductor devices 20 so as to cool each of the semiconductor devices 20 from both sides. Each of the semiconductor device 20 is sandwiched by the coolers 100 from both sides in the Z direction. Most part of the sealing resin body 30 is arranged in facing regions of the adjacent coolers 100. Each of the main terminals 70 extends to the outside of the facing regions in the Y direction, for example, for connection with a bus bar or the like (not shown).

The semiconductor devices 20 are arranged so as to overlap each other in a plan view from the Z direction. In each of the semiconductor devices 20, the switching elements 50 are arranged in the order of the first switching element 51a, the second switching element 52, and the first switching element 51b from an upstream side to a downstream side. That is, in the X direction, the first switching element 51a is arranged adjacent to the supply pipe 101, and the first switching element 51b is arranged adjacent to the discharge pipe 102.

Further, the semiconductor devices 20L and 20U included in the upper and lower arm circuits 11 of the same phase are adjacent to each other in the Z direction. As a result, the low potential terminal 72 of the semiconductor device 20U and the high potential terminal 71 of the semiconductor device 20L, which form the same phase, overlap each other in a plan view from the Z direction. Therefore, the connection distance between the upper arm 11U and the lower arm 11L can be shortened, and for example, the inductance can be reduced. In addition, the connectivity can be improved.

In this way, the semiconductor devices 20 (20U, 20L) are cooled by the coolers 100 in a state of being sandwiched in the Z direction, which is the facing direction.

In the present embodiment, the switching elements 50 include at least one of the first switching element 51 formed on the Si substrate or the second switching element 52 formed on the SiC substrate in a plural number. Therefore, the output of the semiconductor devices 20 can be improved as compared with the configuration including one first switching element 51 and one second switching element 52.

Further, the switching elements 51 and 52 are alternately arranged in the X direction (first direction). The heat dissipation member 40 has non-overlapping regions 41f and 42f as intersecting regions 41d and 42d. The non-overlapping regions 41f and 42f are regions in which the heat of the first switching element 51 and the second switching element 52 is transferred. Since at least a part of the non-overlapping regions 41f and 42f is exposed from the sealing resin body 30, heat can be effectively dissipated. Therefore, the heat generated by the switching elements 51 and 52 tends to diffuse to the non-overlapping regions 41f and 42f. Therefore, an increase in the element temperature can be suppressed.

As described above, it is possible to provide the semiconductor devices 20 capable of suppressing an increase in the element temperature while improving the output. When the element temperature rises, for example, the on-resistance may increase, the reliability of the bonding material 90 may decrease, and the margin with respect to the rated temperature may decrease (output decrease). According to the present embodiment, suppress the occurrence of such issues can be suppressed.

Figure 11:
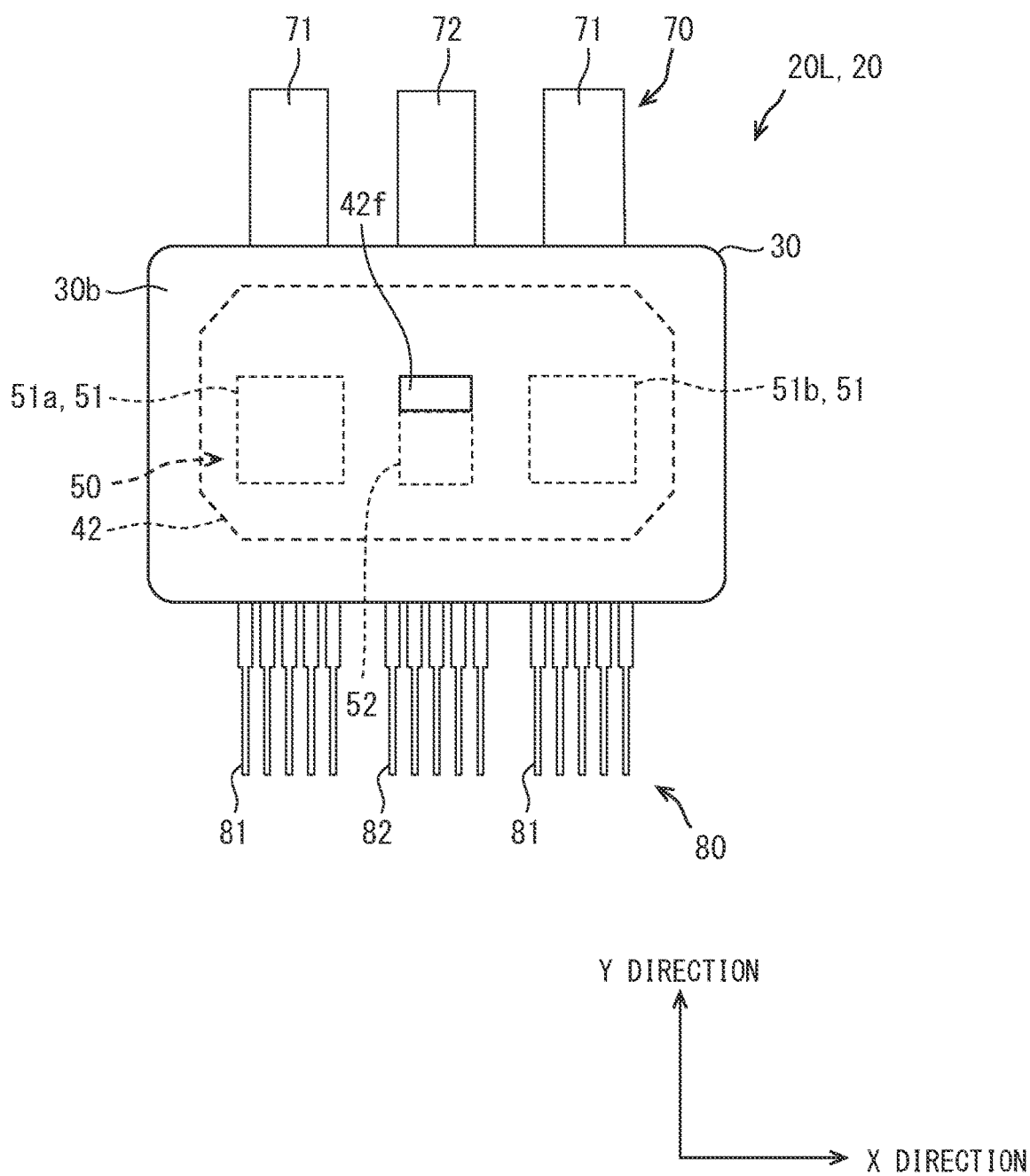
FIG. 11 is a plan view showing a semiconductor device of a modified example.

The heat dissipation members 40 may include at least non-overlapping regions 41f and 42f as exposed portions. For example, as in a modification shown in FIG. 11, only the non-overlapping region 42f of the second heat dissipation member 42 may be exposed from the sealing resin body 30. In FIG. 11, the non-overlapping region 42f is exposed from the heat dissipation surface 42b.

In the present embodiment, in addition to the non-overlapping regions 41f and 42f, at least a part of the overlapping regions 41f and 42f is exposed from the sealing resin body 30. The overlapping regions 41f and 42f are regions directly below the second switching element 52. Therefore, an increase in the element temperature, particularly an increase in the temperature of the second switching element 52 can be effectively suppressed.

In particular, in the present embodiment, almost the entire area of the heat dissipation surfaces 41b and 42b including not only the overlapping regions 41e and 42e and the non-overlapping regions 41f and 42f, but also the region overlapping with the first switching elements 51 is exposed. The increase in the element temperature can be further suppressed by heat dissipation on both sides and exposure over the entire area.

The first switching element 51 and the second switching element 52 may be arranged at least alternately, and the number of the first switching element 51 and the second switching element 52 is not particularly limited. For example, the switching elements 50 may include two first switching elements 51 and two second switching elements 52. In another example, the switching elements 50 may include three first switching elements 51 and two second switching elements 52. In another example, the switching elements 50 may include one first switching element 51 and two second switching elements 52.

In the present embodiment, the switching elements 50 include two first switching elements 51 on which the IGBT 111 is formed and one second switching element 52 on which the MOSFET 112 is formed. The second switching element 52 is arranged between the first switching elements 51. Since the substrate area of the second switching element 52 is small, the heat dissipation members 41 and 42 have non-overlapping regions 41f and 42f. The non-overlapping regions 41f and 42f are free regions that do not overlap with the switching elements 50. Since this free regions are positively used for heat dissipation, it is possible to suppress thermal interference between the first switching elements 51 disposed on both sides of the non-overlapping regions 41f and 42f. Further, the heat of the second switching element 52 adjacent to the non-overlapping regions 41f and 42f in the Y direction can be effectively dissipated. As a result, the increase in temperature of the MOSFET 112 can be suppressed, and thus the increase in the on-resistance can be suppressed.

The number of the high potential terminals 71 and the number of the low potential terminals 72 are not particularly limited. A configuration including one high potential terminal 71 and one low potential terminal 72 may also be adopted. In the present embodiment, the arrangements of the high potential terminals 71 and the low potential terminals 72 are alternated in the arrangement direction of the switching elements 50. As a result, multiple sets of facing side surfaces of the high potential terminals 71 and the low potential terminals 72 are formed. The directions of the main currents in the high potential terminals 71 and the low potential terminals 72 are substantially opposite to each other. By providing multiple sets, the magnetic fluxes generated when the main current flows cancel each other out, and the effect of reducing the inductance can be enhanced. Further, since at least one of the main terminals 71 and 72 is included in a plural number, the inductance can be reduced by parallelization. For example, the surge voltage can be reduced.

In the alternating arrangement, the number of main terminals 71, 72 is not particularly limited. In the present embodiment, the main terminals 70 include one first main terminal, which is one of the main terminals 71 and 72, and two second main terminals, which are the other of the main terminals 71 and 72. In the semiconductor device 20L, the low potential terminal 72 is the first main terminal and the high potential terminal 71 is the second main terminal. In the semiconductor device 20U, the high potential terminal 71 is the first main terminal and the low potential terminal 72 is the second main terminal. The first main terminal is disposed on a virtual line CL1 passing through the elemental center of the second switching element 52. In the plan view from the Z direction, the non-overlapping regions 41f and 42f are disposed on the virtual line CL1.

Figure 12:
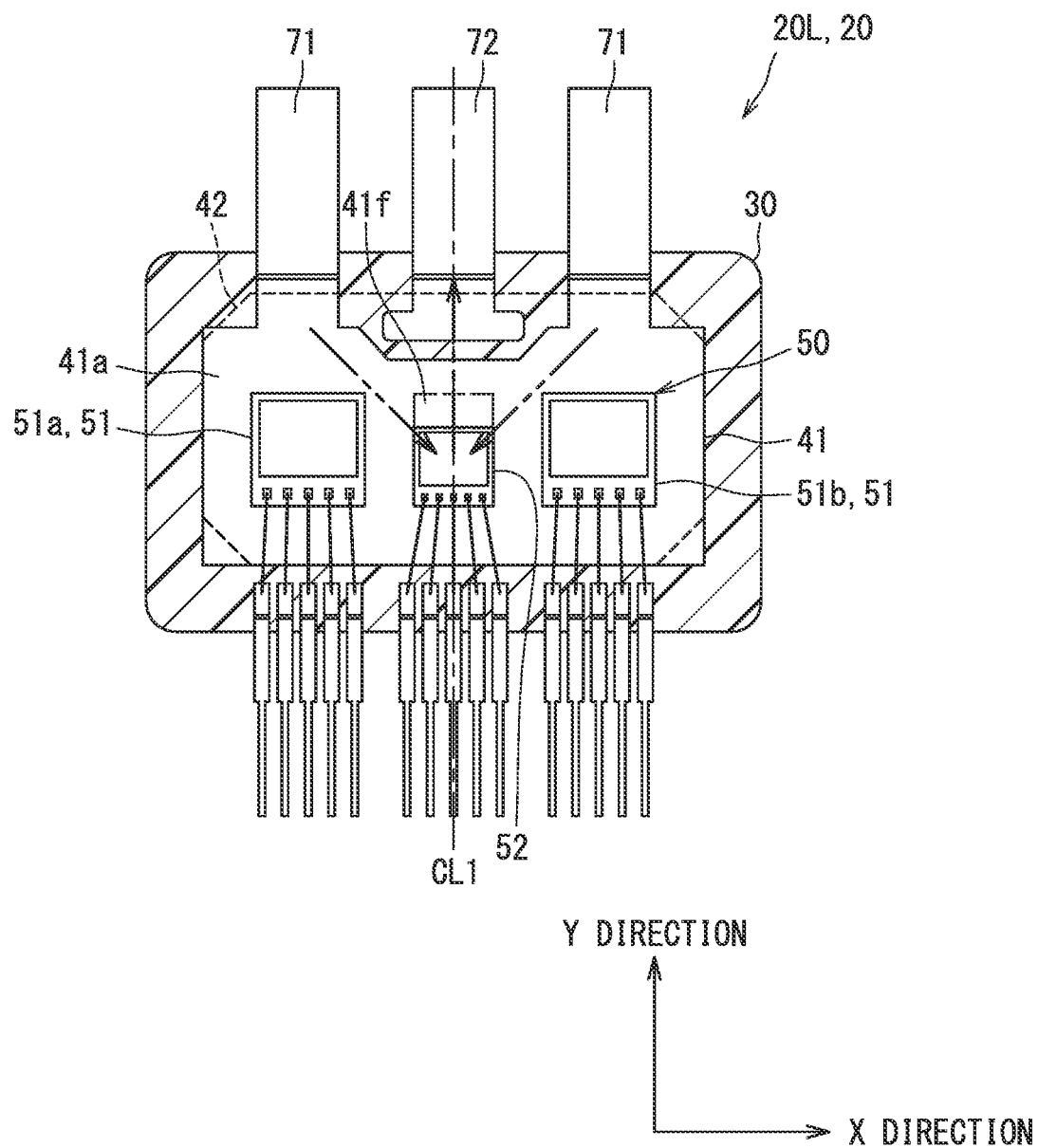
FIG. 12 is a diagram showing a relationship between a current path and a non-overlapping region.

For example, in the semiconductor device 20L shown in FIG. 12, the non-overlapping region 42f is provided in the current path between the first main terminal (the low potential terminal 72) and the second switching element 52. Since the number of the first main terminals is smaller than the number of the second main terminals, the current density in the non-overlapping region 42f is high. However, the non-overlapping region 42f is exposed from the sealing resin body 30 and can efficiently dissipate heat. Therefore, the temperature of the device, especially the temperature of the second switching element 52, can be suppressed from rising. As a result, the increase in the on-resistance of the MOSFET 112 can be suppressed. Although not shown, in the semiconductor device 20U, the non-overlapping region 41f is provided in the current path between the first main terminal (the high potential terminal 71) and the second switching element 52. The non-overlapping region 41f is exposed from the sealing resin body 30 and has the same effect as the semiconductor device 20L.

In the present embodiment, the semiconductor device 20 is provided with an odd number of switching elements 50. The arrangement of the switching elements 50 is linearly symmetrical with respect to the virtual line CL1. The first switching element 51 formed on the Si substrate and the second switching element 52 formed on the SiC substrate have different linear expansion coefficients from each other. However, due to the linearly symmetrical arrangement, the thermal stress acting on the heat dissipation members 40 based on the linear expansion coefficient difference between the heat dissipation members 40 and the switching elements 50 is also symmetrical. As a result, it is possible to suppress local deformation of the semiconductor device 20. Although an example of three switching elements is shown as an odd number, the odd number s not limited to three. For example, the present embodiment can also be applied to a configuration with five switching elements 50.

In the present embodiment, the interval between the second switching element 52 and each of the first switching elements 51a, 51b is approximately equal to each other. As a result, the heat generated by the second switching element 52 spreads almost equally to both sides of the first switching elements 51a and 51b in the X direction. Also, the heat generated by the first switching elements 51a and 51b spreads toward the second switching element 52 in the same way.

Therefore, the temperature difference of the first switching elements 51a, 51b can be reduced and the uneven flow of DC current to one of the first switching elements 51a, 51b can be suppressed. DC current is the current that flows not during switching but during steady state when the switching elements are turned on. In addition, it is possible to suppress the concentration of heat between one of the first switching elements 51 and the second switching element 52. For example, it is possible to suppress the increase in on-resistance due to the temperature rise of the second switching element 52. This is particularly effective in a configuration in which the switching elements 51 and 52 are simultaneously turned on and driven.

Also, since the intervals are approximately equal, air remains between one of the first switching elements 51a, 51b and the second switching element 52 during molding of the sealing resin body 30, and voids in the sealing resin body 30 can be suppressed. If the interval between the second switching element 52 and each of the first switching elements 51a, 51b is set to be approximately equal to each other, the above-described effect can be achieved regardless of whether the heat dissipation members 40 are exposed or not.

Figure 13:
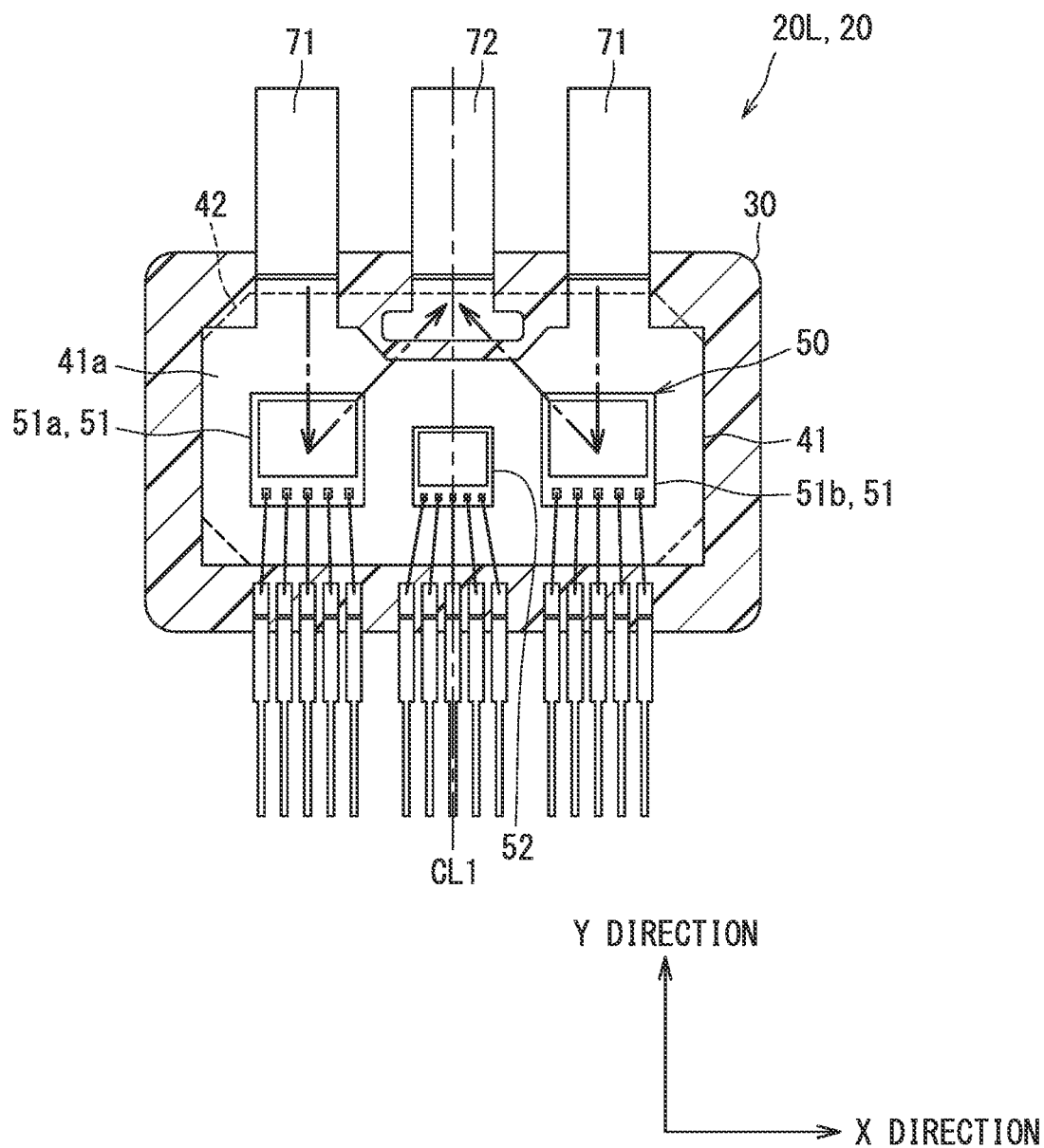
FIG. 13 is a diagram showing current imbalance suppression.

In the present embodiment, not only the switching elements 50, but also the heat dissipation members 40 and the main terminals 70 are linearly symmetrical with respect to the virtual line CL1. Due to the linearly symmetrical arrangement, the main current of the first switching element 51a and the main current of the first switching element 51b flow in a linearly symmetrical manner with respect to the virtual line CL1. For example, in the semiconductor device 20L, the lengths of the two current paths are almost equal, as shown in FIG. 13. One of the current paths is the current path from the high potential terminal 71 adjacent to the first switching element 51a→the first switching element 51a→the low potential terminal 72. The other one of the current paths is the current path of the high potential terminal 71 adjacent to the first switching element 51b→the first switching element 51b→the low potential terminal 72. Since the inductances of the current paths are almost equal to each other, it is possible to suppress the AC current from flowing unevenly to one of the first switching elements 51a and 51b. Therefore, the unbalance of AC current can be suppressed. The same applies to the semiconductor device 20U. AC current is the current that flows during switching.

Second Embodiment

A second embodiment is a modification of the preceding embodiment as a basic configuration and may incorporate description of the preceding embodiment. The present embodiment is characterized by the relationship between the drive and arrangement of the switching elements 50.

The configuration of the semiconductor device 20 of the present embodiment is the same as that of the semiconductor device 20U (see FIG. 7) shown in the preceding embodiment. The switching elements 50 include at least one of the first switching element 51 or the second switching element 52 in a plural number. For example, the switching elements 50 include two first switching elements 51 and one second switching element 52. The arrangement of the switching elements 51 and 52 is alternate in the X direction.

Figure 14A:
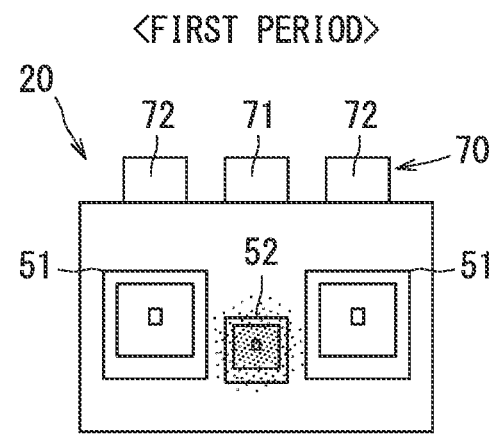
FIG. 14A is a diagram showing a heat generation state in a first period in a semiconductor device according to a second embodiment.
Figure 14B:
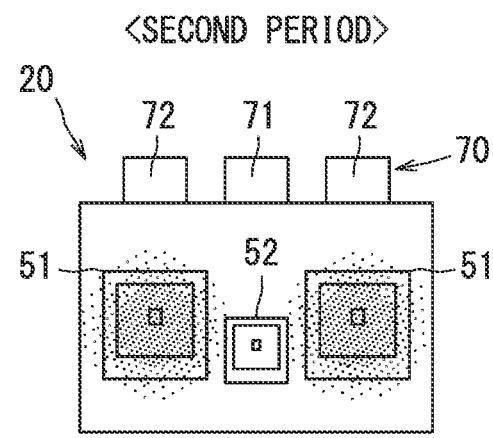
FIG. 14B is a diagram showing a heat generation state in a second period in a semiconductor device according to a second embodiment.

In the present embodiment, the control circuit 7 and the drive IC 8 control the first switching elements 51 (the IGBT 111) and the second switching element 52 (the MOSFET 112) to be on-driven at least for different periods of time. The control circuit 7 and the drive IC 8 control the switching elements 51 and 52 so that the switching elements 51 and 52 have a period of being individually turned on. As shown in FIG. 14A, the second switching element 52 is driven on in a first period, and as shown in FIG. 14B, the first switching elements 51 are driven on in a second period. FIG. 14A and FIG. 14B show the heat generated by the switching elements 50 by the on-drive.

The control circuit 7 and the drive IC 8 control the first switching elements 51 so as to turn off in a first current region and turn on in a second current region larger than the first current region. The control circuit 7 and the drive IC 8 control the second switching element 52 so as to turn on in the first current region and turn off in the second current region. The first current region is a region below a predetermined first threshold value, and the second current region is a region above the first threshold value. The first current region is a region where the output current is smaller than the second current region, and the second current region is a region where the output current is larger than the first current region. The first period is a period in which the output current is in the first current region, and the second period is a period in which the output current in the second current region flows.

In a small current range, the on-resistance of the SiC-MOSFET is smaller than the on-resistance of the Si-IGBT. On the other hand, in a large current region, the on-resistance of the Si-IGBT is smaller than the on-resistance of the SiC-MOSFET. Therefore, the above-described control can reduce the on-resistance in a wide current range.

The control circuit 7 and the drive IC 8 control the switching elements 51 and 52 so as to have a period in which the IGBT 111 and the MOSFET 112 are individually on-driven and a period in which the IGBT 111 and the MOSFET 112 are both on-driven. The control circuit 7 and the drive IC 8 turn on both the IGBT 111 and the MOSFET 112 in a third current region equal to or larger than the second threshold value. The second threshold value is a current value larger than the first threshold value. When having the second threshold value, the second current region is a region equal to or greater than the first threshold value and less than the second threshold value. Since both the IGBT 111 and the MOSFET 112 are driven on during the same period, the output can be further increased.

In this way, the second switching element 52 (the MOSFET 112) is driven on in the first current region, and the first switching elements 51 (the IGBTs 111) are driven on in the second current region. Further, in the third current region, the switching elements 51 and 52 are driven on.

In the present embodiment, the switching elements 50 include at least one of the first switching element 51 or the second switching element 52 in a plural number. As a result, the number of switching elements 50 connected in parallel, particularly the number of switching elements 50 that are on-driven in the same period can be increased, and the output of the semiconductor device 20 can be improved.

Further, the first switching elements 51 and the second switching element 52 are alternately arranged in the X direction. The first switching elements 51 and the second switching element 52 are driven on at least for different periods of time. As described above, the second switching element 52 is driven on in the first period. In the second period different from the first period, the first switching elements 51 are driven on.

The second switching element 52 that is driven on in the first period is arranged between the first switching elements 51 that are driven on in the second period. With this arrangement, as shown in FIGS. 14A and 14B, the distance between the first switching elements 51 that are on-driven in the same period can be secured, and the mutual thermal interference of the first switching elements 51 can be reduced. Therefore, the semiconductor device according to the present embodiment can improve the output and suppress the increase in size as compared with a configuration in which switching elements that are on-driven in the same period are adjacent to each other, such as the order of the first switching element, the first switching element, and the second switching element.

The first switching elements 51 and the second switching element 52 may be arranged at least alternately. The switching elements 50 of the present embodiment include two first switching elements 51 and one second switching element 52. As described above, the on-resistance of the second switching element (the MOSFET 112) is small in the small current region, and the on-resistance of the first switching elements 51 (the IGBTs 111) is small in the large current region.

The second switching element 52 is driven on in the first current region, and the first switching elements 51 are driven on in the second current region larger than the first current region. The small current range can be covered by one second switching element 52, and the large current range can be covered by two first switching elements 51. Therefore, the loss (conduction loss) can be reduced in the wide current range. Further, it is possible to reduce the thermal interference of the first switching elements 51a and 51b that are driven on in the second current region. Therefore, it is possible to enhance the effect of suppressing the increase in size while improving the output.

In the present embodiment, an example of switching the drive of the switching elements 50 in the three current ranges has been described, but the present disclosure is not limited to this example. The switching elements 51 and 52 may be on-driven at least for different periods of time, and various combinations are possible. For example, the switching elements 51 and 52 may be controlled so as not to be driven on during the same period. That is, the second switching element 52 may be driven on in a small current region, and the first switching elements 51 may be driven on in a current region larger than the small current region. Further, the second current region may be divided into a region in which one first switching element 51 is on-driven and a region in which two first switching elements 51 are on-driven.

Further, by making the energization times of the switching elements 51 and 52 different, specifically, by shifting at least one of the turn-on or the turn-off, it is possible to have a period of on-driving each other and a period of individually on-driving. For example, in the small current region, the energization time of the first switching element 51 may be set to be shorter than the energization time of the second switching element 52, and in the large current region, the energization time of the second switching element 52 may be set to be shorter than the energization time of the first switching element 51.

The configuration shown in the present embodiment can be combined with the configuration described in the preceding embodiment. For example, the configuration according to the present embodiment may be combined with a configuration in which a part of the heat dissipation members 40 is exposed from the sealing resin body 30, or a configuration in which the entire heat dissipation members 40 are covered by the sealing resin body 30. The configuration according to the present embodiment may be combined with a configuration using different semiconductor devices 20U and 20L for the upper arm 11U and the lower arm 11L. The configuration according to the present embodiment may be combined with a configuration using the semiconductor devices 20 having the same structure for the upper arm 11U and the lower arm 11L. The arrangement of at least one of the heat dissipation members 40, the switching elements 50, or the main terminals 70 may be linearly symmetrical with respect to the virtual line CL1.

Third Embodiment

A third embodiment is a modification of the preceding embodiments as a basic configuration and may incorporate description of the preceding embodiments. The present embodiment is characterized by the arrangement of the second main terminals.

Figure 15:
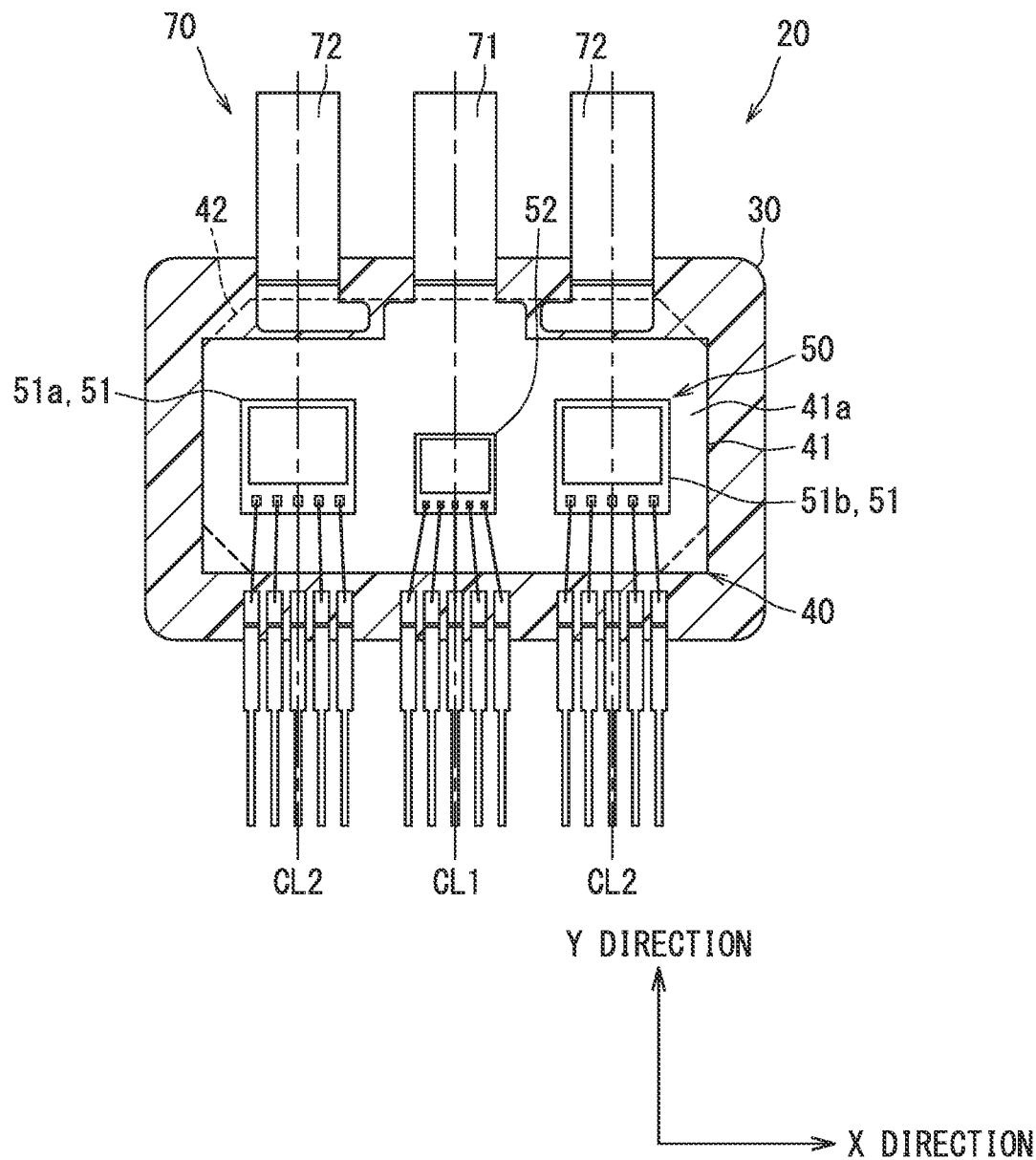
FIG. 15 is a diagram showing a semiconductor device according to a third embodiment.

FIG. 15 shows the semiconductor device 20 of the present embodiment. The configuration of the semiconductor device 20 is substantially the same as that of the semiconductor device 20U (see FIG. 7) shown in the preceding embodiment. The switching elements 50 include two first switching elements 51 and one second switching element 52. The main terminals 70 include one high potential terminal 71 and two low potential terminals 72. The high potential terminal 71 is the first main terminal arranged on the virtual line CL1, and the low potential terminals 72 are the second main terminals. The center of the width of the high potential terminal 71 is disposed on the virtual line CL1.

The virtual lines CL2 shown in FIG. 15 are lines extending in the Y direction through the respective element centers of the first switching elements 51*a* and 51*b*. The virtual line CL1 passes through the center positions of the two virtual lines CL2. One of the low potential terminals 72 is arranged on the virtual line CL2 on the first switching element 51*a*, and the other one of the low potential terminals 72 is arranged on the virtual line CL2 on the first switching element 51*b*. The centers of the widths of the low potential terminals 72 are disposed on the virtual lines CL2, respectively.

Figure 16:
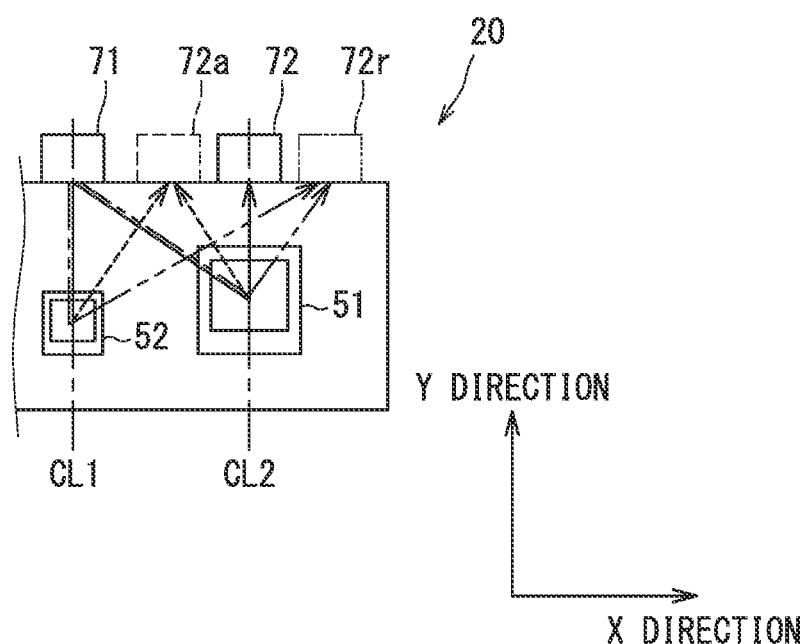
FIG. 16 is a diagram showing an arrangement of main terminals and current paths.

The main terminals of the present embodiment include one first main terminal and two second main terminals. The first main terminal is arranged on the virtual line CL1. The second main terminals are arranged on the virtual lines CL2, respectively. FIG. 16 shows the current paths. In FIG. 16, for convenience, a part in the X direction is omitted so as to include one of the first switching elements 51. In FIG. 16, the flow of the main current at a predetermined timing is indicated by an arrow. In FIG. 16, a low potential terminal 72*r* (a second main terminal) according to a reference example is shown by a long dashed double-short dashed line.

The high potential terminal 71, which is the first main terminal, is arranged on the virtual line CL1. The low potential terminal 72, which is the second main terminal, is arranged on the virtual line CL2. Therefore, a current flows as shown by the solid arrow. The low potential terminal 72*r*, which is the reference example, is disposed outside the virtual line CL2 at a position not overlapping with the virtual line CL2. Therefore, a current flows as shown by the long dashed double-short dashed line arrow. According to the arrangement of the low potential terminals 72 of the present embodiment, the current paths of the switching elements 51 and 52 can be shortened as compared with the reference example. Further, the current loop formed between the high potential terminal 71, each of the switching elements 51 and 52, and the low potential terminal 72 can be made smaller than that of the reference example. Therefore, the inductance can be reduced as compared with the reference example. For example, the switching loss can be reduced.

In the present embodiment, an example in which the second main terminals are arranged on the virtual lines CL2 has been shown, but the present disclosure is not limited to this example. The second main terminal may be arranged at a position that does not overlap with the virtual line CL2 and inside the virtual line CL2. In FIG. 16, the second main terminal having such an arrangement is shown by a broken line as a low potential terminal 72*a*. According to this configuration, a current flows as shown by the broken line arrow. Compared with the above-described reference example, the current path of the second switching element 52 can be shortened. Further, the current loop of each of the switching elements 51 and 52 can be made smaller than that of the reference example. Therefore, the inductance can be reduced as compared with the reference example.

Even if the low potential terminal 72 is disposed on the virtual line CL2, if the center of the width of the low potential terminal 72 is outside the virtual line CL2, the current paths of the switching elements 51 and 52 are longer than those of the configuration in which the center of the width of the low potential terminal 72 is disposed on the virtual line CL2. Also, the current loop becomes large. Therefore, it is preferable to arrange the low potential terminal 72 (the second main terminal) so that the center of the width is located on the virtual line CL2 or is located inside the virtual line CL2, that is, close to the virtual line CL1.

In the present embodiment, the arrangement of the heat dissipation members 40, the switching elements 50, and the main terminals 70 is linearly symmetrical with respect to the virtual line CL1. As a result, the imbalance of the AC current can be suppressed as in the preceding embodiments. According to the present embodiment, the switching loss can be reduced while suppressing current imbalance.

The configuration shown in the present embodiment can be combined with the configurations described in the preceding embodiments. For example, the configuration according to the present embodiment may be combined with a configuration in which a part of the heat dissipation members 40 is exposed from the sealing resin body 30, or a configuration in which the entire heat dissipation members 40 are covered by the sealing resin body 30. The configuration according to the present embodiment may be combined with a configuration using different semiconductor devices 20U and 20L for the upper arm 11U and the lower arm 11L. For example, in the case of the semiconductor device 20L shown in FIG. 4, the low potential terminal 72 corresponds to the first main terminal, and the high potential terminal 71 corresponds to the second main terminal. The configuration according to the present embodiment may be combined with a configuration using the semiconductor devices 20 having the same structure for the upper arm 11U and the lower arm 11L.

The drive of the switching elements 51 and 52 is not particularly limited. The configuration according to the present embodiment may be combined with a configuration in which the switching elements 51, 52 are driven on at least for different periods of time. In this case, mutual thermal interference between the first switching elements 51 can be reduced.

Fourth Embodiment

A fourth embodiment is a modification of the preceding embodiments as a basic configuration and may incorporate description of the preceding embodiments. The present embodiment is characterized by the dimensional relationship of the switching elements 51 and 52.

Figure 17:
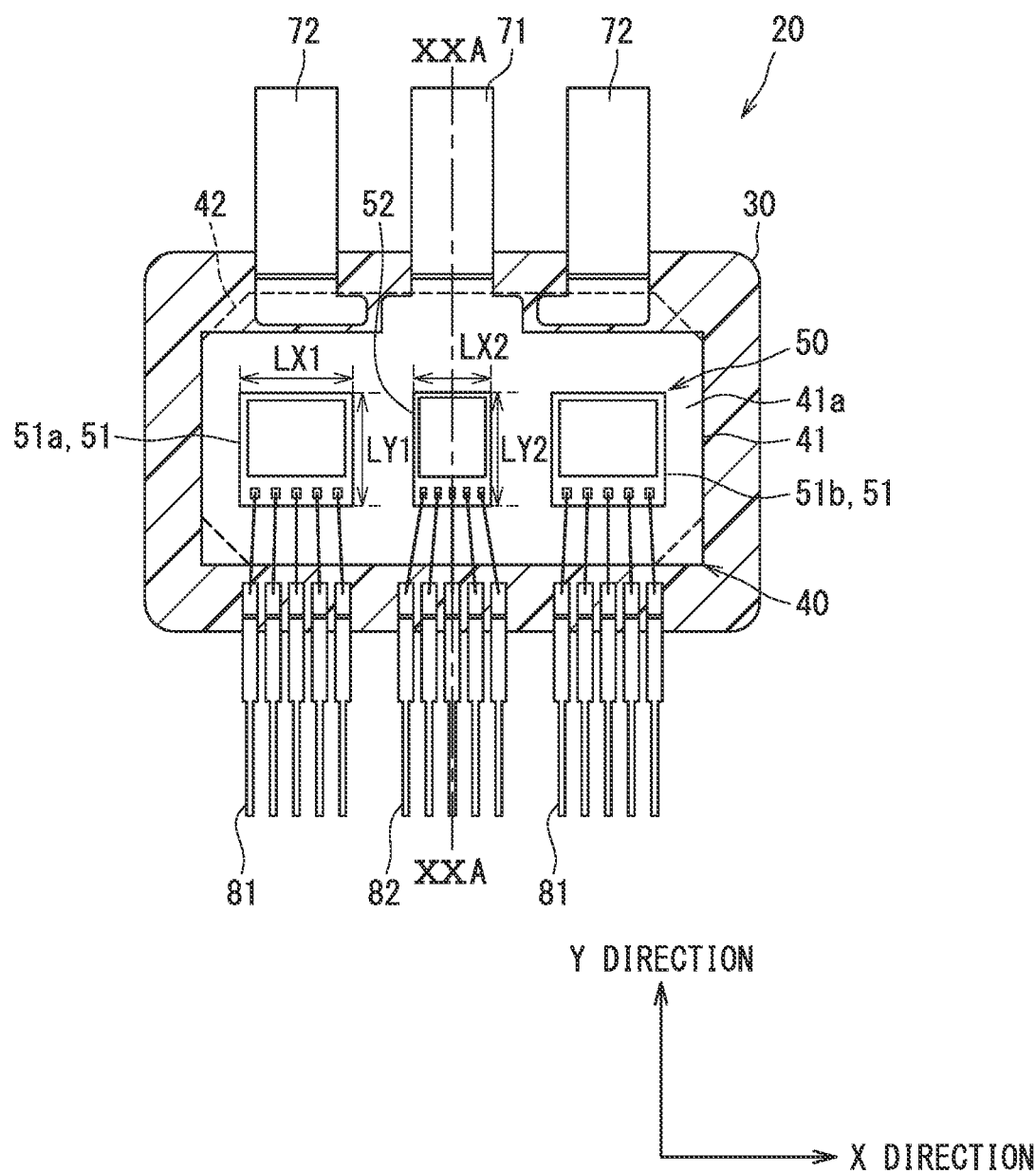
FIG. 17 is a diagram showing a semiconductor device according to a fourth embodiment.

FIG. 17 shows the semiconductor device 20 of the present embodiment. The switching elements 50 include at least one of the first switching element 51 or the second switching element 52 in a plural number. The configuration of the semiconductor device 20 is substantially the same as that of the semiconductor device 20U (see FIG. 7) shown in the preceding embodiment. The semiconductor device 20 includes two first switching elements 51 and one second switching element 52. The arrangement of the switching elements 51 and 52 is alternate in the X direction.

The substrate area of the second switching element 52 is smaller than the substrate area of the first switching element 51. In the first switching element 51, the length in the X direction is LX1 and the length in the Y direction is LY1. The ratio R1 of the length in the Y direction to the length in the X direction is LY1/LX1. In the second switching element 52, the length in the X direction is LX2 and the length in the Y direction is LY2. The ratio R2 of the length in the Y direction to the length in the X direction is LY2/LX2. The second switching element 52 has a substantially rectangular shape with the Y direction as the longitudinal direction.

The length LX2 is shorter than the length LX1 (LX2<LX1). The ratio R2 is larger than the ratio R1 (R2>R1). Further, the length LY2 is substantially equal to the length LY1. The positions of both ends in the Y direction are substantially the same for the first switching elements 51 and the second switching element 52.

Next, the effect of the above dimensional relationship will be described with reference to FIGS. 18A to 20B. In each of FIGS. 18A to 20B, the present embodiment and reference examples are shown in comparison with each other. In the reference examples, the elements identical or related to the present embodiment are denoted by adding "r" to the tails of the reference numerals in the present embodiment. In the present embodiment and the reference examples, the dimensions of the first switching elements are equal to each other. Further, the intervals between the first switching elements and the second switching element are made equal to each other. In FIGS. 18A to 20B, the semiconductor devices are shown in a simplified manner.

Figure 18A:
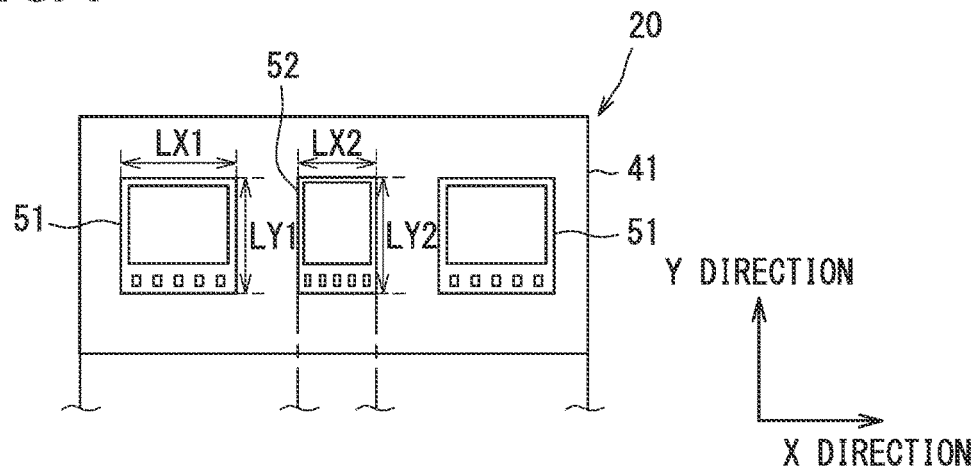
FIG. 18A is a diagram showing a dimensional relationship in a semiconductor device according to a fourth embodiment.
Figure 18B:
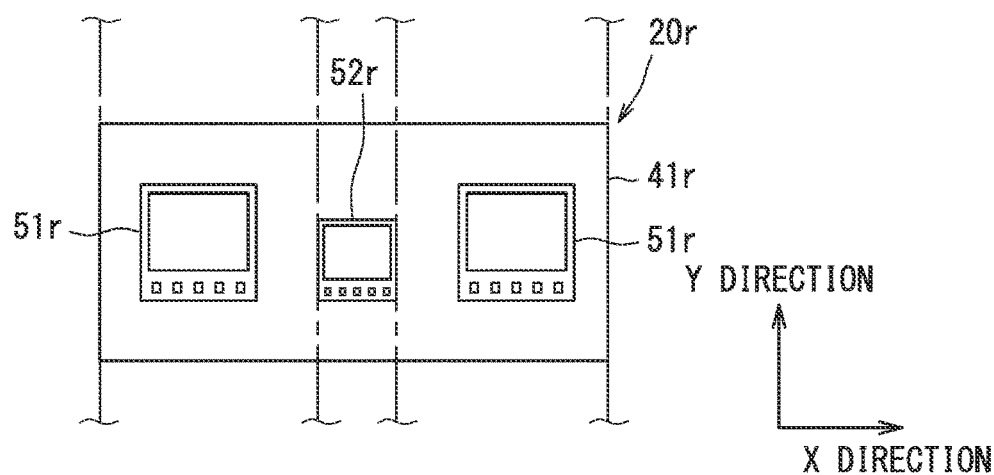
FIG. 18B is a diagram showing a dimensional relationship in a semiconductor device according to a first reference example.
Figure 18C:
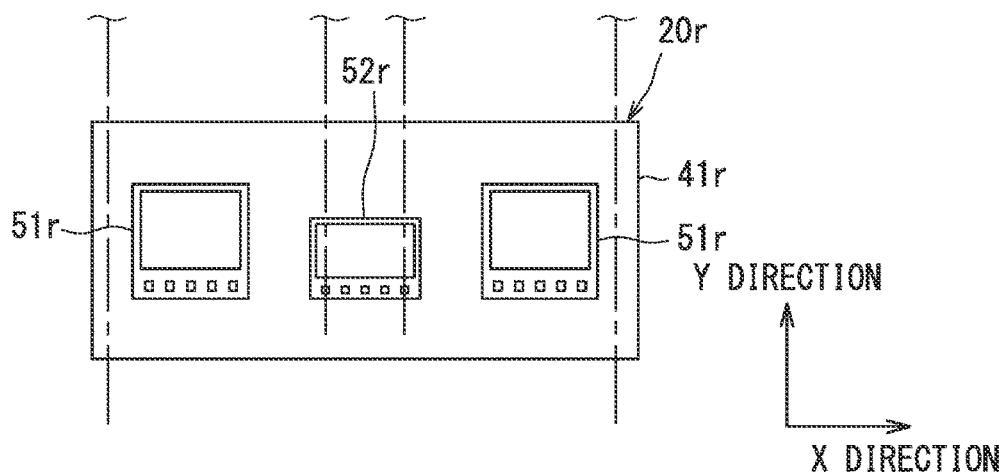
FIG. 18C is a diagram showing a dimensional relationship in a semiconductor device of according to a second reference example.

FIG. 18A shows the present embodiment, and FIGS. 18B and 18C are diagrams showing a first reference example and a second reference example, respectively. In the first reference example shown in FIG. 18B, the length of the second switching element 52r is shorter than the length of the first switching element 51r in the X direction. In the X direction, the length of the second switching element 52r is equal to the length of the second switching element 52. In the Y direction, the length of the second switching element 52r is shorter than the length of the second switching element 52. In the first reference example, the relationship of the length ratio is R2≤R1.

In the present embodiment, the relationship of the length ratio is R2>R1. Therefore, the substrate area of the second switching element 52 is larger than that of the second switching element 52r. As a result, the active region of the semiconductor elements according to the present embodiment is larger than the active region of the semiconductor elements according to the first reference example. Therefore, according to the present embodiment, it is possible to improve the output as compared with the first reference example while keeping the size in the X direction equivalent to the size of the first reference example.

In the second reference example shown in FIG. 18C, the substrate area of the second switching element 52r is equal to the substrate area of the second switching element 52. In the X direction, the length of the second switching element 52r is longer than the length of the second switching element 52. In the second reference example, the relationship of the length ratio is R2≤R1. In the second reference example, the substrate area of the second switching element 52r is increased by setting the X direction, which is the alignment direction, as the longitudinal direction.

In the present embodiment, the relationship of the length ratio is R2>R1, and the length of the second switching element 52 is shorter than the length of the second switching element 52r in the X direction. Since the second switching element 52 is short, the size in the X direction is smaller than the size of the second reference example. Therefore, according to the present embodiment, it is possible to make the size in the X direction smaller than the size of the first reference example while keeping the output equivalent to the output of the second reference example.

As described above, according to the semiconductor device 20 according to the present embodiment, it is possible to suppress the increase in the size while improving the output. In particular, in the present embodiment, the length LY2 of the second switching element 52 is substantially equal to the length LY1 of the first switching element 51. Compared with the configuration satisfying LY2<LY1, the substrate area of the second switching element 52 can be increased and the output can be further improved. Further, the positions of both ends in the Y direction are substantially the same in the first switching element 51 and the second switching element 52. As a result, the output can be improved while suppressing the increase in the size of the semiconductor device 20 in the Y direction.

Figure 19A:
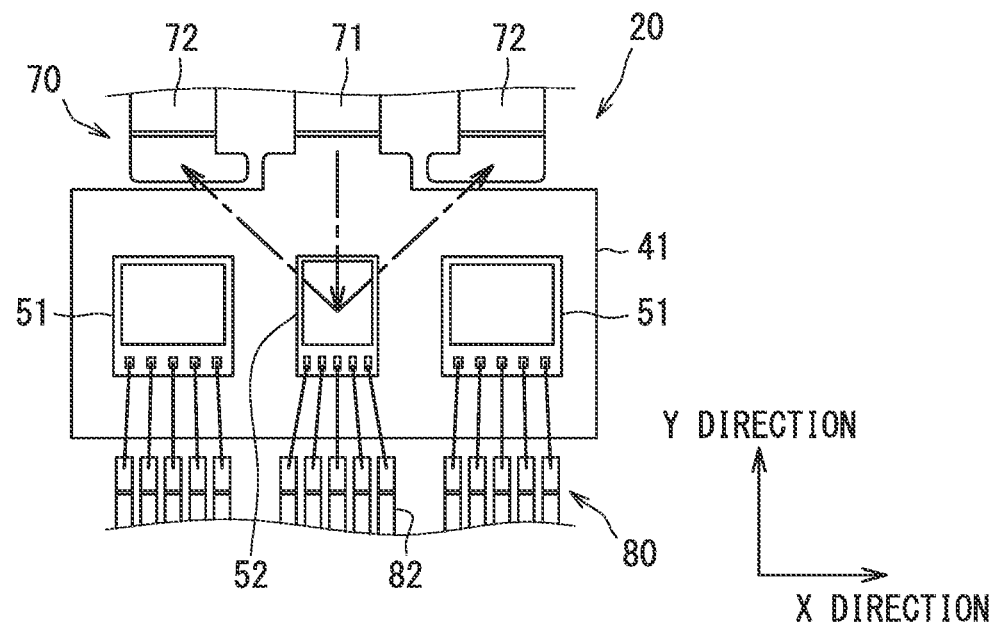
FIG. 19A is a diagram showing a positional relationship between a second switching element and a main terminal in the semiconductor device according to the fourth embodiment.
Figure 19B:
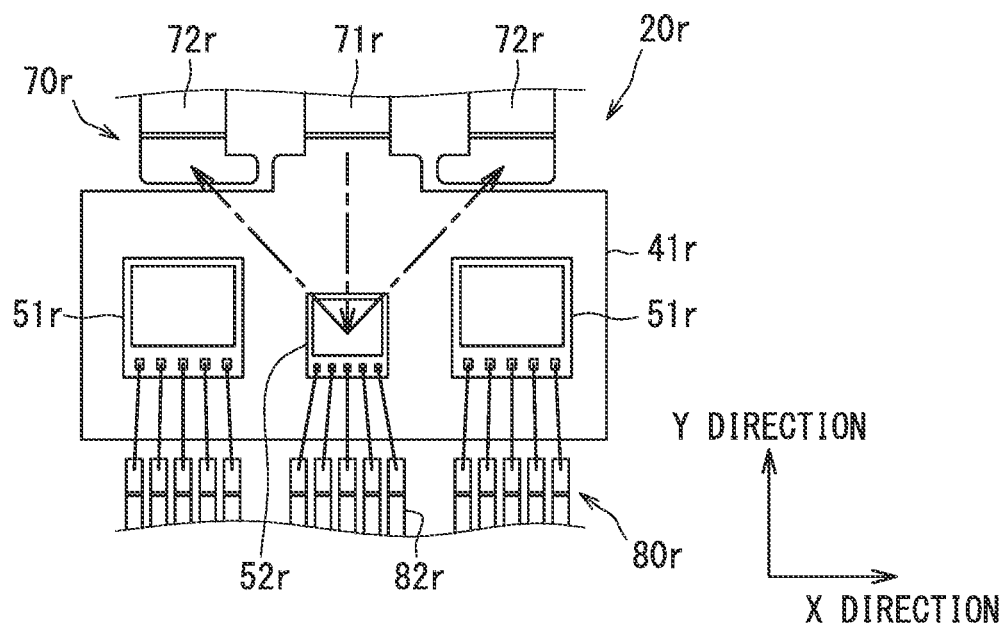
FIG. 19B is a diagram showing a positional relationship between a second switching element and a main terminal in the semiconductor device according to the first reference example.

FIG. 19A is a diagram showing the present embodiment, and FIG. 19B is a diagram showing a reference example. The configuration of the second switching element 52r shown in FIG. 19B is the same as the configuration of the first reference example shown in FIG. 18B. The relationship of the length ratio is R2≤R1. In the Y direction, the positions of the ends adjacent to the signal terminals 80r are substantially the same among the first switching elements 51r and the second switching element 52r. The second switching element 52r is arranged closer to the signal terminals 80r in the Y direction. Therefore, as shown by the arrow of the long dashed short dashed line, the main current path of the second switching element 52r is long.

In the present embodiment, the relationship of the length ratio is R2>R1. The arrangement of the second switching element 52 is closer to the main terminals 70 than in the reference example. As a result, the current path of the second switching element 52 can be shortened. Therefore, the switching loss can be reduced.

Although not shown, as a reference example, a configuration in which the positions of the ends adjacent to the main terminal 70r in the Y direction are substantially matched between the first switching elements 51r and the second switching element 52r, that is, the second switching element 52r is arranged closer to the main terminals 70r is also conceivable. In this case, the distances between the second switching element 52r and the second signal terminals 82r become long. Compared to this reference example, the second switching element 52 of the present embodiment is arranged closer to the second signal terminals 82. Therefore, it is advantageous for high-speed switching of the second switching element 52 (the MOSFET 112).

Figure 20A:
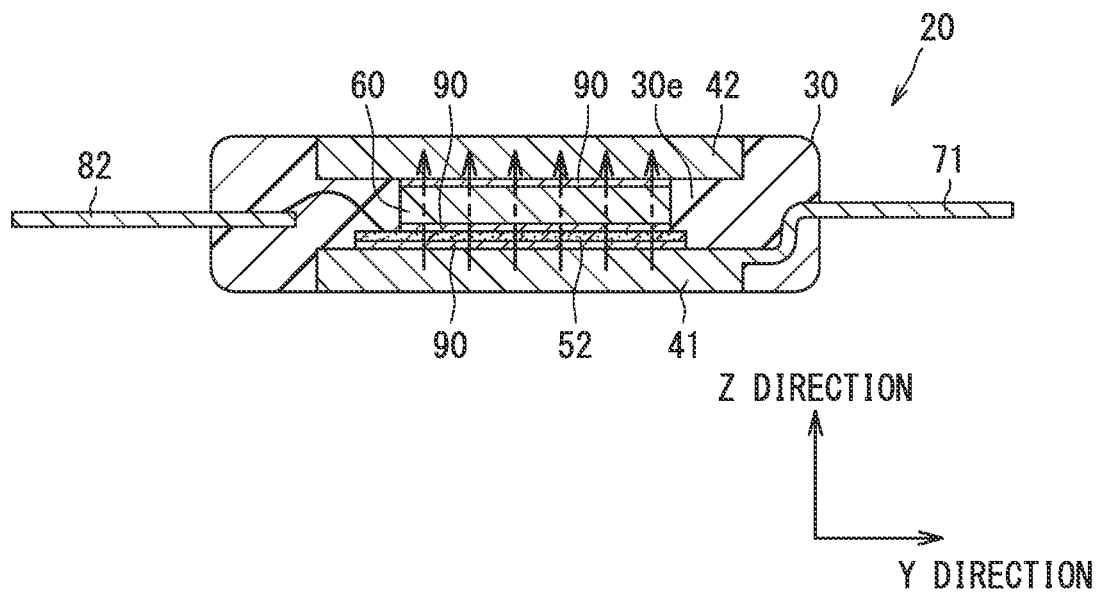
FIG. 20A is a simplified cross-sectional view of the semiconductor device taken along line XXA-XXA in FIG. 17.
Figure 20B:
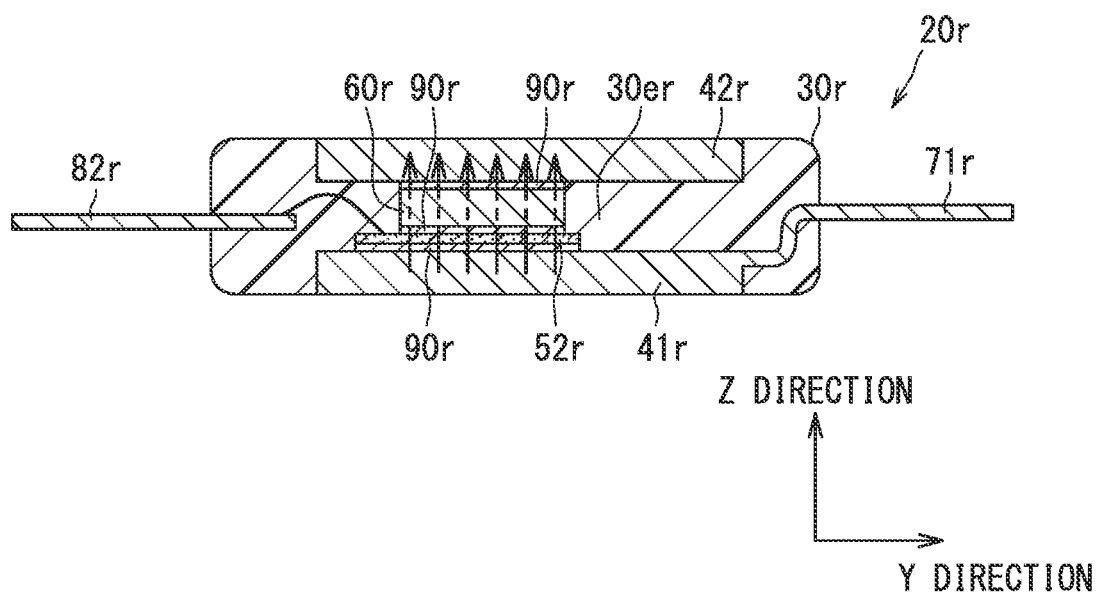
FIG. 20B is a simplified cross-sectional view of the semiconductor device according to the reference example.

FIG. 20A is a diagram in which a cross section taken along the line XXA-XXA of FIG. 17 is simplified. FIG. 20A is a diagram showing the present embodiment, and FIG. 20B is a diagram showing a reference example. In the reference example shown in FIG. 20B, the second switching element 52r has the same arrangement as that of the first reference example shown in FIG. 18B. The relationship of the length ratio is R2≤R1. Therefore, the substrate area of the second switching element 52r is small. The cross-sectional area of the terminal 60r is also small.

In the present embodiment, the relationship of the length ratio is R2>R1. As a result, the substrate area of the second switching element 52 is larger than the substrate area of the reference example. Further, the cross-sectional area of the terminal 60 is larger than the cross-sectional area of the reference example. Therefore, as shown by the arrow of the long dashed short dashed line, the current density can be reduced as compared with the reference example. For example, the electromigration effect increases with increase in the flowing current. According to the present embodiment, the life of the bonding material 90 can be particularly improved by reducing the current density.

Further, as shown in FIG. 20B, since the second switching element 52r of the reference example has a small substrate area, the ratio of the second switching element 52r and the terminal 60r is small in the facing regions of the heat dissipation members 41r and 42r. That is, a part of the sealing resin body 30r that enters the facing region is large. The sealing resin body 30r has an intervening portion 30er sandwiched between the heat dissipation members 41r and 42r. A part of the intervening portion 30er is adjacent to the second switching element 52r in the Y direction. On the other hand, in the present embodiment, since the substrate area of the second switching element 52 is larger than the substrate area of the reference example, the intervening portion 30e can be made smaller than the intervening portion 30er of the reference example. A part of the intervening portion 30er shown in the reference example is replaced with the second switching element 52 and the terminal 60. Accordingly, it may be possible to improve the heat dissipation.

The length LY2 may be shorter than the length LY1 as long as the length ratio satisfies the relationship of R2>R1. Since the relationship of R2>R1 is satisfied, the output can be improved as compared with the configuration in which R2≤R1. If the length LY2 is made longer than the length LY1, the output can be further improved, but the physique in the Y direction increases. Further, when the positions of both ends of the switching elements 51 and 52 are shifted in the Y direction, the size in the Y direction also increases. Therefore, as shown in FIG. 17, it is preferable that the length LY2 is substantially equal to the length LY1 and the positions of both ends in the Y direction are substantially the same among the first switching elements 51 and the second switching element 52.

The number of the first switching element 51 and the second switching element 52 is not particularly limited. Any number may be employed as long as the first switching element 51 and the second switching element 52 can be arranged alternately.

The configuration shown in the present embodiment can be combined with the configurations described in the preceding embodiments. For example, the configuration according to the present embodiment may be combined with a configuration in which a part of the heat dissipation members 40 is exposed from the sealing resin body 30, or a configuration in which the entire heat dissipation members 40 are covered by the sealing resin body 30. The configuration according to the present embodiment may be combined with a configuration using different semiconductor devices 20U and 20L for the upper arm 11U and the lower arm 11L. The configuration according to the present embodiment may be combined with a configuration using the semiconductor devices 20 having the same structure for the upper arm 11U and the lower arm 11L. The drive of the switching elements 51 and 52 is not particularly limited.

Fifth Embodiment

A fifth embodiment is a modification of the preceding embodiments as a basic configuration and may incorporate description of the preceding embodiments. The present embodiment can be characterized by the positional relationship between the switching elements 51 and 52.

In a configuration in which one second switching element 52 is arranged between two first switching elements 51, the intervals between the second switching element 52 and the first switching elements 51a and 51b may be different from each other.

FIG. 17 shows the semiconductor device 20 of the present embodiment. The configuration of the semiconductor device 20 is substantially the same as the configuration of the semiconductor device 20U (see FIG. 7) shown in the preceding embodiment. As shown in the preceding embodiment, in the cooling structure, the first switching element 51a is on the upstream side of the refrigerant, and the first switching element 51b is on the downstream side. The first switching elements 51a and 51b are driven on during the same period. In the present embodiment, the arrangement of the second switching element 52 is closer to the first switching element 51a than to the first switching element 51b.

Figure 21:
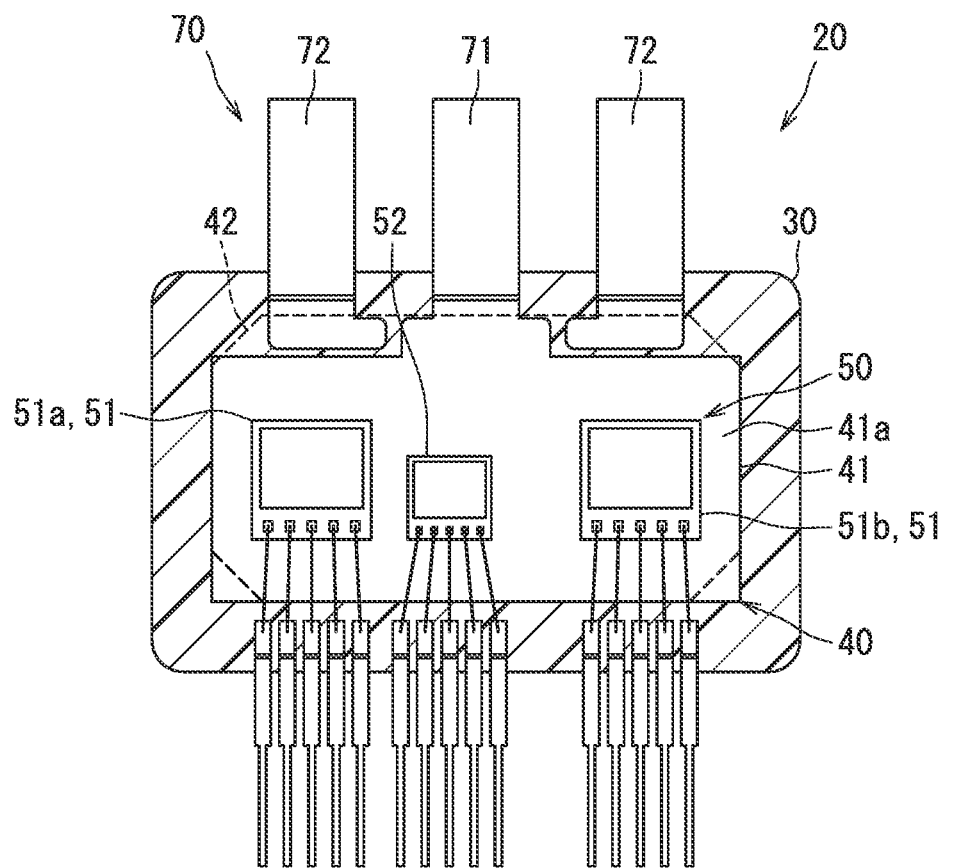
FIG. 21 is a diagram showing a semiconductor device according to a fifth embodiment.
Figure 21:
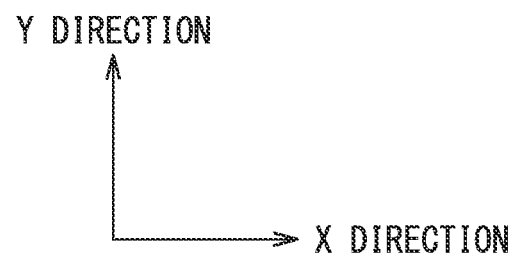

According to the arrangement shown in FIG. 21, the heat of the second switching element 52 is easily transferred to the first switching element 51a that is cooled more than the first switching element 51b. Thereby, the temperature difference between the first switching elements 51a and 51b can be reduced. Therefore, the difference between the on-resistances of the first switching elements 51a and 51b becomes small, and the imbalance of the DC current can be suppressed.

Further, in a case where the first switching element 51a and the first switching element 51b have different on-drive periods together with the second switching element 52, configurations having different intervals may be applied. For example, it is assumed that the first switching element 51a is driven on with the second switching element 52 more frequently than the first switching element 51b. As an example, the switching elements 51a and 52 are driven on in an A current region, and the switching elements 51a, 51b and 52 are driven on in a B current region larger than the A region. As another example, the switching elements 51a and 52 are driven on in the A current region, and the switching elements 51a and 51b are driven on in the B current region larger than the A region.

By arranging the second switching element 52 near the first switching element 51a, the current paths of the first switching element 51a and the second switching element 52, which are frequently on-driven in the same period, come close to each other. Therefore, the inductance of the current paths can be reduced. When the first switching element 51b is driven on with the second switching element 52 more frequently, the second switching element 52 may be arranged near the first switching element 51b.

<Modifications>

For the second switching element 52 arranged between the two first switching elements 51, the position in the Y direction can be variously changed.

Figure 22:
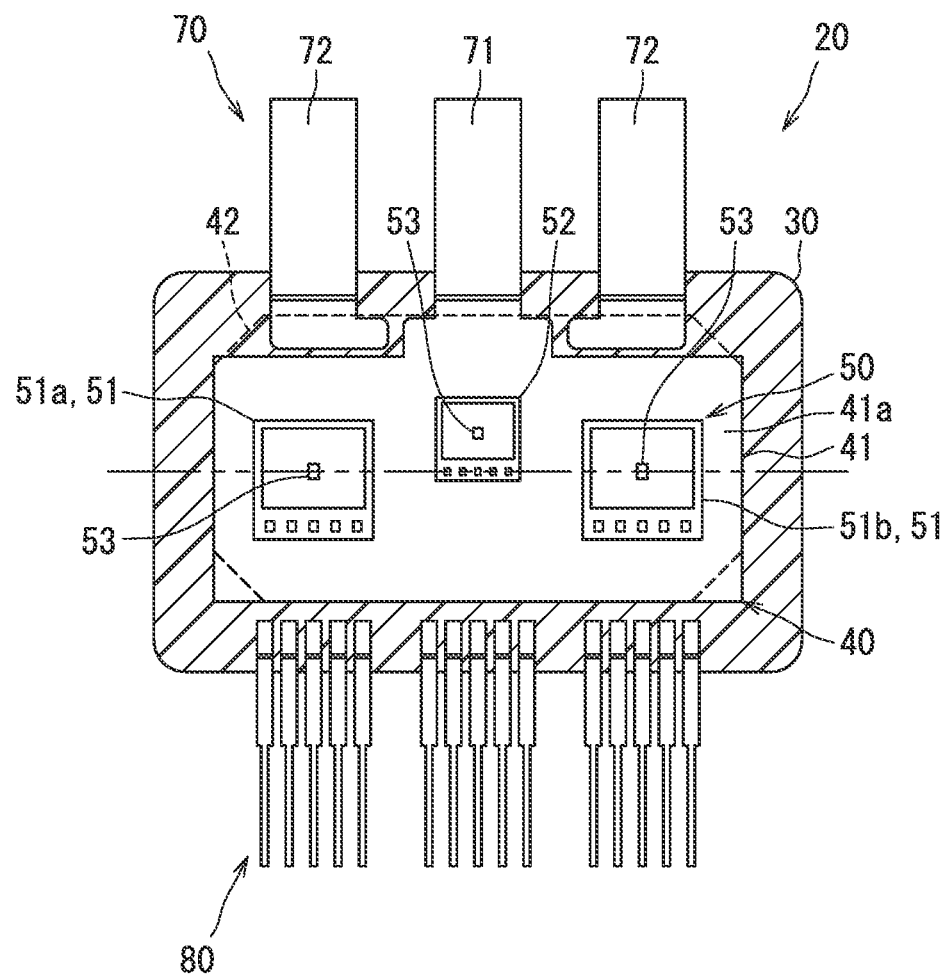
FIG. 22 is a diagram showing a semiconductor device according to another modification.

For example, the second switching element 52 may be arranged so that the center of the active regions of the first switching elements 51 and the second switching element 52 are shifted in the Y direction. In the modification shown in FIG. 22, the temperature sensor 53 (temperature sensitive diode) is provided substantially in the center of the active region of each of the switching elements 51 and 52 as in the preceding embodiments. Then, the centers of the active regions, that is, the temperature sensors 53, are shifted in the Y direction between the first switching elements 51 and the second switching element 52. The second switching element 52 is arranged closer to the main terminals 71 in the Y direction. The configuration of the semiconductor device 20 shown in FIG. 22 is similar to the configuration of the preceding embodiment (see FIG. 15) except for the arrangement of the second switching element 52. In FIG. 22, the bonding wires 91 are omitted for convenience.

As described above, in the element, the vicinity of the center of the active region is the maximum heat generation point. By displacing the centers of the active regions between the first switching elements 51 and the second switching element 52, the distance between the centers becomes longer. As a result, mutual thermal interference can be suppressed in the switching elements 51 and 52 that are driven on during the same period. Further, since the second switching element 52 is close to the main terminals 70, the inductance of the main circuit can be reduced.

Also in the configuration shown in the preceding embodiment (see, for example, FIGS. 4 and 7), the centers of the active regions of the first switching elements 51 and the second switching element 52 are shifted in the Y direction. Therefore, the same effect as the configuration shown in FIG. 22 can be obtained. In the preceding embodiment, the positions of the ends of the switching elements 51 and 52 adjacent to the signal terminal 80 are substantially the same in the Y direction. For example, since the gate wiring can be shortened, it is advantageous for high-speed switching of the second switching element 52 (the MOSFET 112).

Figure 23:
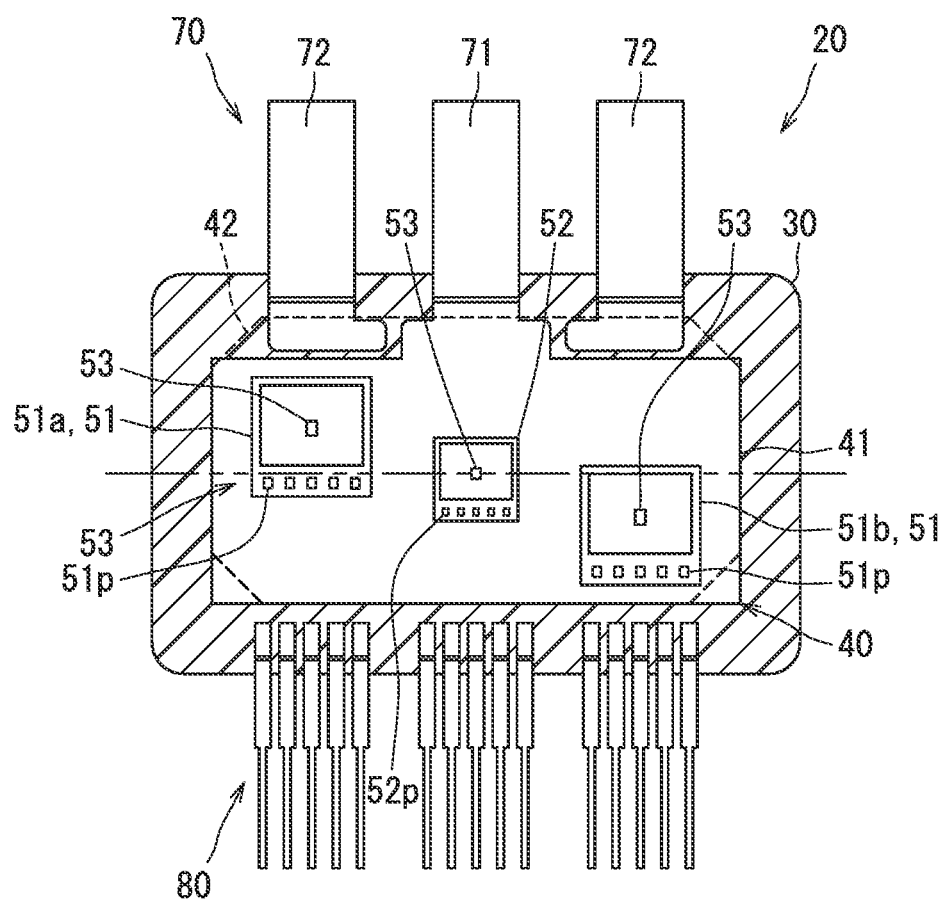
FIG. 23 is a diagram showing a semiconductor device according to another modification.

In a modification shown in FIG. 23, the second switching element 52 is arranged between the two first switching elements 51a and 51b in the X direction and between the two first switching elements 51a and 51b in the Y direction. The temperature sensors 53 of the switching elements 50 are shifted from each other in the Y direction. In FIG. 23, the temperature sensor 53 of the first switching element 51a is closest to the main terminals 70, and the temperature sensor 53 of the first switching element 51b is the farthest from the main terminals 70. That is, in the three switching elements 50, the positions of the maximum heat generating points are shifted from each other in the Y direction orthogonal to the flow direction of the refrigerant. Therefore, each of the switching elements 51 and 52 that are driven on during the same period can be effectively cooled.

In the example shown in FIG. 23, in the adjacent switching elements 50, the inactive region on the upstream side faces the active region on the downstream side in the X direction. For example, the formation region of the pads 51p in the first switching element 51a faces the active region of the second switching element 52. Further, the formation region of the pads 52p in the second switching element 52 faces the active region of the first switching element 51b. As a result, it is possible to suppress the increase in size in the Y direction while suppressing thermal interference between the adjacent switching elements 50. The configuration of the semiconductor device 20 shown in FIG. 23 is similar to the configuration of FIG. 22 except for the arrangement of the switching elements 50.

Figure 24:
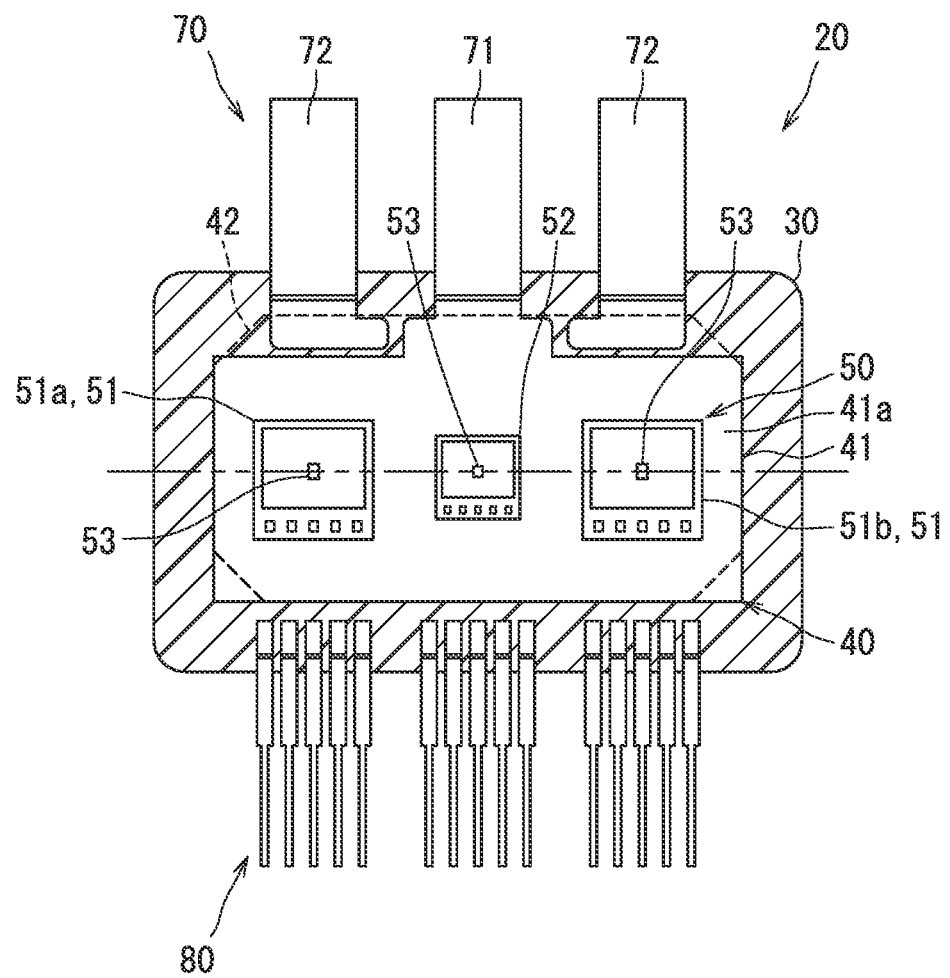
FIG. 24 is a diagram showing a semiconductor device according to another modification.

The switching elements 51 and 52 of a modification shown in FIG. 24 are not driven on during the same period. The centers of the active regions of the switching elements 51 and 52 are substantially the same in the Y direction. Since the switching elements 51 and 52 are not driven on at the same time, there is almost no influence of mutual heat. Therefore, the second switching element 52 can be arranged at the center position of the heat dissipation member 40. With this arrangement, heat dissipation is improved and the temperature rise of the second switching element 52 can be suppressed. Therefore, it is possible to suppress an increase in the on-resistance of the second switching element 52 (the MOSFET 112). The configuration of the semiconductor device 20 shown in FIG. 24 is similar to the configuration of FIG. 22 except for the arrangement of the switching elements 50.

Also in the configuration shown in the preceding embodiment (see FIG. 17), the centers of the active regions of the switching elements 51 and 52 are substantially the same in the Y direction. Therefore, in a configuration in which the switching elements 51 and 52 are not driven on during the same period, the same effect as the configuration shown in FIG. 24 can be obtained.

The configuration shown in the present embodiment can be combined with the configurations described in the preceding embodiments. For example, the configuration according to the present embodiment may be combined with a configuration in which a part of the heat dissipation members 40 is exposed from the sealing resin body 30, or a configuration in which the entire heat dissipation members 40 are covered by the sealing resin body 30. The configuration according to the present embodiment may be combined with a configuration using different semiconductor devices 20U and 20L for the upper arm 11U and the lower arm 11L. The configuration according to the present embodiment may be combined with a configuration using the semiconductor devices 20 having the same structure for the upper arm 11U and the lower arm 11L.

Sixth Embodiment

A sixth embodiment is a modification of the preceding embodiments as a basic configuration and may incorporate description of the preceding embodiments. The present embodiment is characterized by the arrangement of the signal terminals 80.

Figure 25:
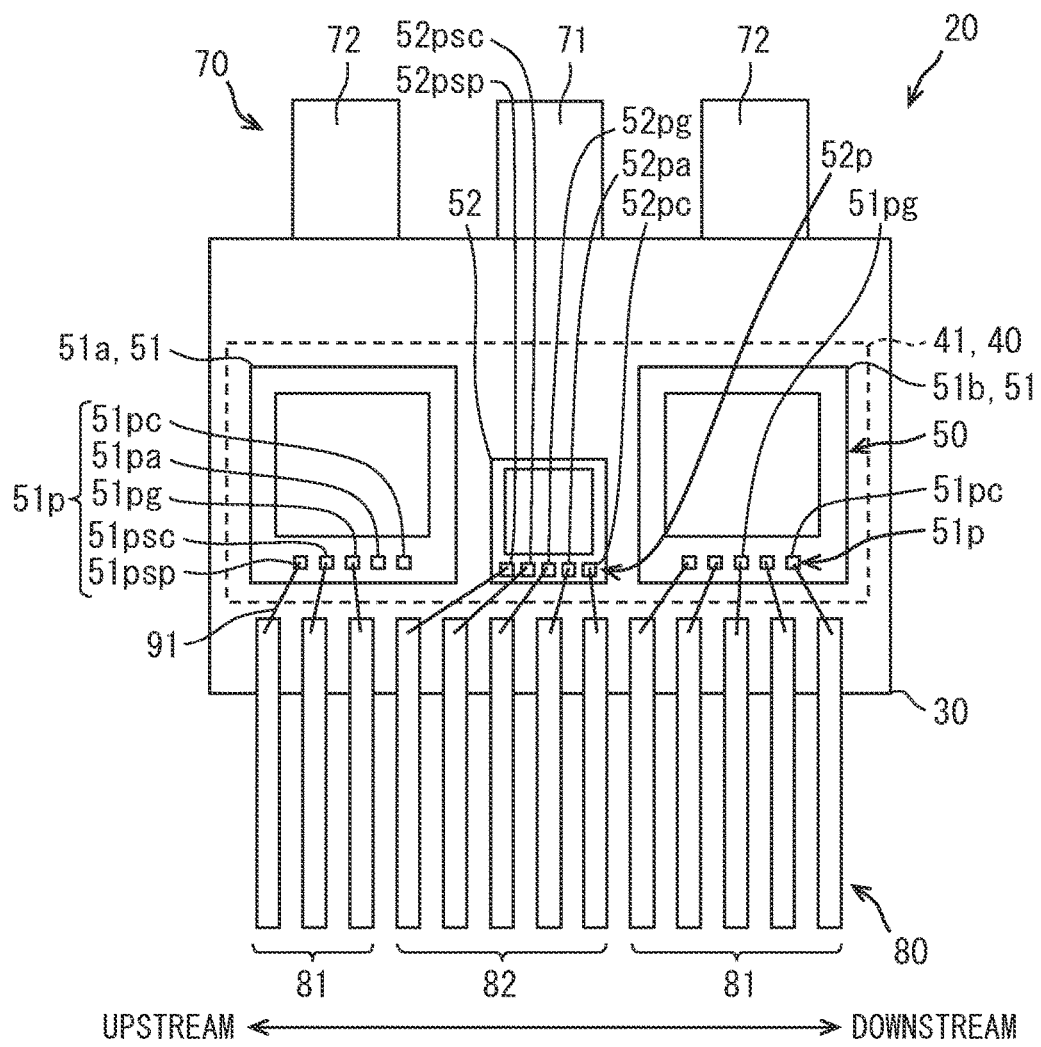
FIG. 25 is a diagram showing a semiconductor device according to a sixth embodiment.

FIG. 25 shows the semiconductor device 20 of the present embodiment. The switching elements 50 include at least one of the first switching element 51 or the second switching element 52 in a plural number. The configuration of the semiconductor device 20 is substantially the same as the configuration of the semiconductor device 20U (see FIG. 7) shown in the preceding embodiment. The switching elements 50 include two first switching elements 51 and one second switching element 52. The arrangement of the switching elements 51 and 52 is alternate in the X direction. In FIG. 25, among the elements in the sealing resin body 30, the switching elements 50 and the signal terminals 80 are shown by solid lines for convenience. Further, in the heat dissipation members 40, the first heat dissipation member 41 is shown by a broken line.

The switching elements 51 and 52 have the corresponding pads 51p and 52p as described above. The flow direction of the refrigerant substantially coincides with the X direction, which is the arrangement direction of the switching elements 50. The pads 51p are provided in the order of a reference potential pad 51psp, a current sense pad 51psc, a gate pad 51pg, and temperature sense pads 51pa, 51pc from the upstream side. The pads 52p are provided in the order of a reference potential pad 52psp, a current sense pad 52psc, a gate pad 52pg, and temperature sense pads 52pa, 52pc from the upstream side. The order of the pads 51p and 52p is the same as each other.

The reference potential pads 51psp and 52psp are pads for detecting a reference potential with respect to the gate drive signal. The reference potential pad 51psp is a pad for detecting an emitter potential, and is also called a Kelvin emitter pad. The reference potential pad 52psp is a pad for detecting a source potential, and is also called a Kelvin source pad.

The current sense pads 51psc and 52psc are pads for detecting the current flowing through sense elements formed in the switching elements 51 and 52. In each of the first switching elements 51, the configuration of the sense element is the same as the configuration of the IGBT 111 formed in the active region. The sense element is formed in a sense region having a smaller area than the active region (for example, about ¹⁄₁₀₀₀), and a current proportional to the IGBT 111 flows. In the second switching element 52, the configuration of the sense element is the same as the configuration of the MOSFET 112 formed in the active region. The sense element is formed in a sense region having a smaller area than the active region, and a current proportional to the MOSFET 112 flows. The current sense pads 51psc and 52psc are pads for detecting a current that correlates with the main current.

The gate pads 51pg and 52pg are pads to which the gate drive signal is input. The temperature sense pads 51pa and 51pc are pads for detecting the substrate temperatures of the first switching elements 51. The temperature sense pads 51pa and 51pc are electrically connected to the temperature sensors 53 formed on the first switching elements 51. The temperature sense pads 52pa and 52pc are pads for detecting the substrate temperature of the second switching element 52. The temperature sense pads 52pa and 52pc are electrically connected to the temperature sensor 53 formed on the second switching element 52. The temperature sense pads 51pa and 52pa are pads for detecting the anode potential of the temperature sensing diode, which is the temperature sensor 53. The temperature sense pads 51pc and 52pc are pads for detecting the cathode potential.

Among the switching elements 50, the pads 51p of the first switching element 51b disposed on the most downstream side and the pads 52p of the second switching element 52 are connected to the signal terminals 80, respectively. On the other hand, among the pads 51p of the first switching element 51a disposed on the most upstream side, the reference potential pad 51psp, the current sense pad 51psc, and the gate pad 51pg are connected to the corresponding signal terminals 80. The temperature sense pads 51pa and 51pc are not provided with the corresponding signal terminals 80. In this way, the signal terminals 80 are thinned out. The semiconductor device 20 has 13 signal terminals 80 for 15 pads 51p and 52p.

The drive IC 8 has a determination circuit (not shown). The determination circuit determines whether or not an overcurrent has occurred in the switching elements 50 based on, for example, signals acquired via the current sense pads 51psc, 52psc and the signal terminals 80. The determination circuit determines whether or not the switching element 50 is in an overheated state based on the signals acquired via the temperature sense pads 51pa, 51pc, 52pa, 52pc and the signal terminals 80. The drive IC 8 outputs a drive signal according to the determination result. The determination circuit may be provided in the control circuit 7.

In the present embodiment, the switching elements 50 include at least one of the switching elements 51 or 52 in the plural number. Specifically, the switching elements 50 include two first switching elements 51 and one second switching element 52. Therefore, the output of the semiconductor devices 20 can be improved as compared with the configuration including one first switching element 51 and one second switching element 52.

Further, due to the alternate arrangement, the switching elements 50 include the multiple first switching element 51 in which the substrates are the same type as the first switching element 51b disposed on the most downstream side. The multiple first switching elements 51 have a period of being on-driven at the same time. In the multiple first switching elements 51, the flowing currents are substantially the same as each other, and the losses are substantially the same as each other. On the other hand, the temperature of the refrigerant rises due to heat exchange with the switching elements 50, and becomes lower toward the upstream side and higher toward the downstream side. Therefore, the thermal resistance increases and the substrate temperature rises toward the downstream side. The temperature sense pads 51pa and 51pc of the first switching element 51b disposed on the most downstream side are connected to the signal terminals 80. Therefore, it is possible to protect the first switching element 51a on the upstream side from overheating based on the substrate temperature of the first switching element 51b.

Further, since the signal terminals 80 corresponding to the temperature sense pads 51pa and 51pc of the first switching element 51a on the upstream side are not provided, the total number of signal terminals 80 included in the semiconductor device 20 can be reduced. Accordingly, the number of signal terminals 80 can be reduced while improving the output. It should be noted that the effect can be achieved in both the case where the switching elements 51 and 52 have a period for being on-driven at the same time and the case where the switching elements 51 and 52 do not have a period for being on-driven at the same time.

<Modifications>

The order of the pads 51p and 52p is not limited to the above example. The order of the temperature sense pads 51pa and 51pc may be reversed. Similarly, the order of the temperature sense pads 52pa and 52pc may be reversed.

Figure 26:
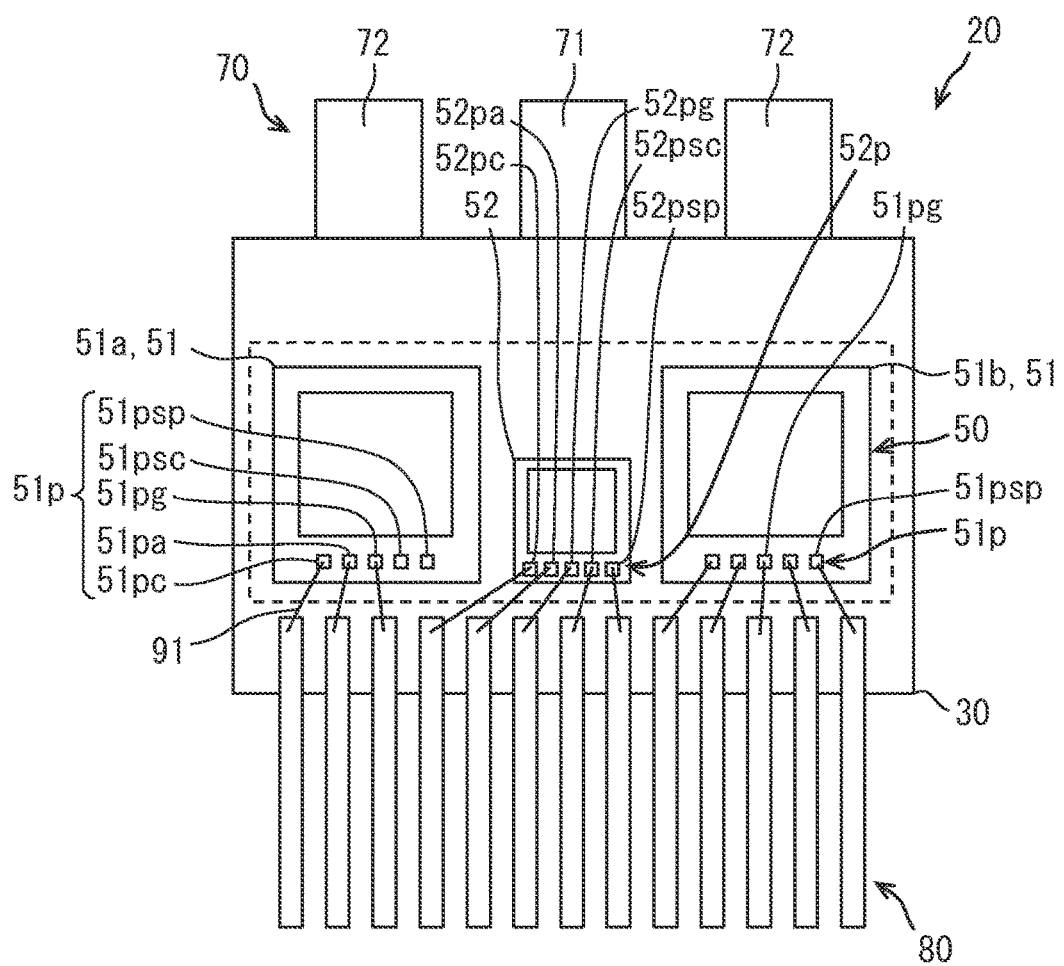
FIG. 26 is a diagram showing a semiconductor device according to another modification.

In a modification shown in FIG. 26, for example, in the pads 51p, the temperature sense pads 51pa and 51pc are disposed on the upstream side. Specifically, the temperature sense pad 51*pc* and the temperature sense pad 51*pa* are provided in this order from the upstream side. The pads 52*p* have an arrangement similar to the pads 51*p*. According to this configuration, in the first switching element 51*a*, the bonding wires 91 connecting the remaining pads 51*p* excluding the temperature sense pads 51*pa* and 51*pc* and the signal terminals 80 become long. According to the configuration shown in FIG. 25, the lengths of the bonding wires 91 are shorter than those shown in FIG. 26. As a result, when the sealing resin body 30 is molded, the wire flow (displacement) accompanying the flow of the resin can be reduced. Therefore, it is possible to suppress a decrease in the connection reliability of the bonding wires 91.

The number of switching elements 51 and 52 is not limited to the above example. For example, the switching element 50 may include three first switching elements 51 and two second switching elements 52. In this case, the signal terminals 80 corresponding to the temperature sense pads 51*pa* and 51*pc* may be provided only on the most downstream side of the three first switching elements 51. Further, the signal terminals 80 corresponding to the temperature sense pads 51*pa* and 51*pc* may be provided for the two first switching elements 51 disposed on the downstream side, and the signal terminals 80 corresponding to the temperature sense pads 51*pa* and 51*pc* of the first switching element 51 disposed on the most upstream side may be omitted.

An example in which the first switching element 51 is disposed on the most downstream side has been shown, but the present disclosure is not limited to this example. The second switching element 52 may be disposed on the most downstream side. When the switching elements 50 includes one first switching element 51 and two second switching elements 52, the pads 52*p* disposed on the most downstream side are connected to the signal terminals 80. Among the pads 52*p* disposed on the most upstream side, the reference potential pad 52*psp*, the current sense pad 52*psc*, and the gate pad 51*pg* are connected to the signal terminals 80. Then, the signal terminals 80 for the temperature sense pads 52*pa* and 52*pc* are omitted.

That is, in the switching elements having the same substrate type as the switching element disposed on the most downstream side, the signal terminals corresponding to the temperature sense pads are provided only in a part of the switching elements including at least the switching element disposed on the most downstream side. Then, the signal terminals corresponding to the temperature sense pads may be omitted for the switching element disposed on the more upstream side than the part.

Figure 27:
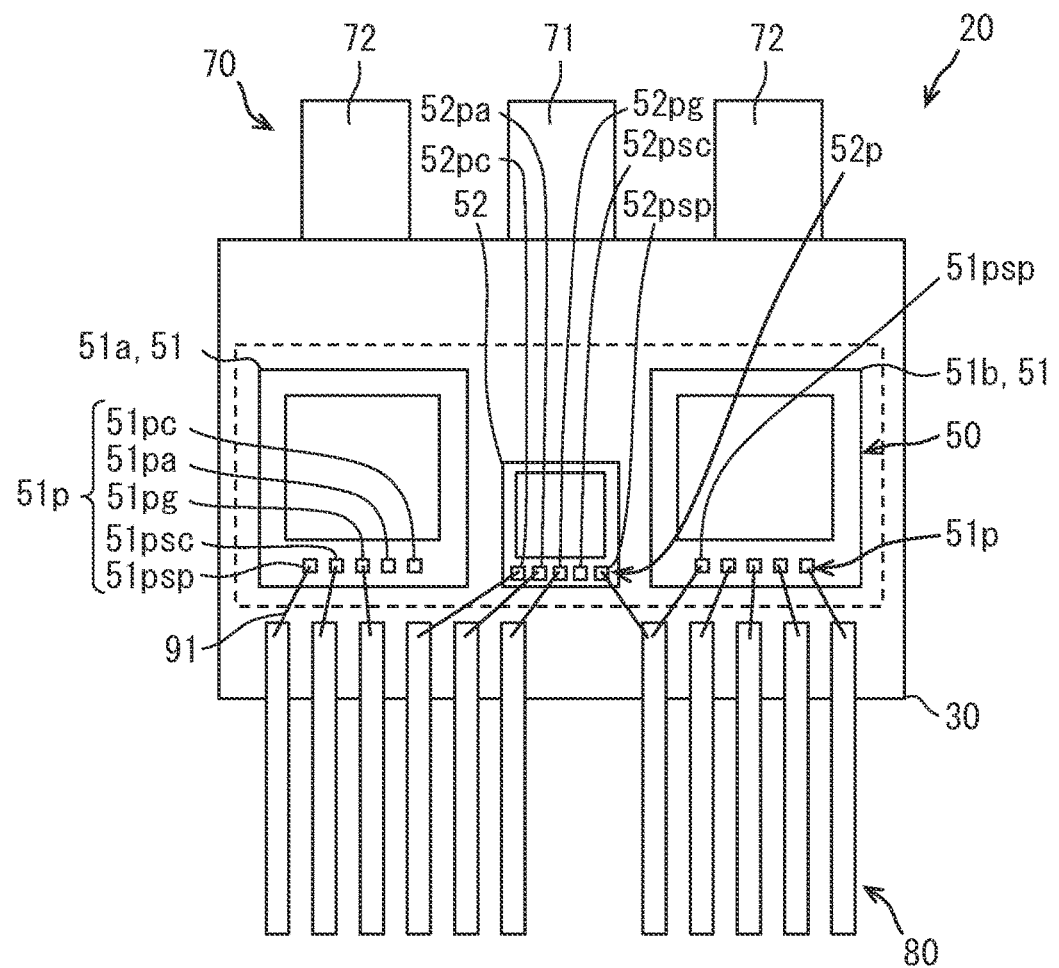
FIG. 27 is a diagram showing a semiconductor device according to another modification.

In a modification shown in FIG. 27, the arrangement of the pads 52*p* and the number of signal terminals 80 are different from those of FIG. 25. The order of the pads 51*p* is the same as in FIG. 25. The pads 52*p* are provided in the order of the temperature sense pads 52*pc*, 52*pa*, the gate pad 52*pg*, the current sense pad 52*psc*, and the reference potential pad 52*psp* from the upstream side. That is, the reference potential pad 51*psp* is provided on the most upstream stream side in the first switching element 51, and the reference potential pad 52*psp* is provided on the most downstream side in the second switching element 52.

Then, the reference potential pad 51*psp* of the first switching element 51*b* and the reference potential pad 52*psp* of the second switching element 52 are connected to the same signal terminal 80. By sharing the signal terminal 80 for the adjacent reference potential pads 51*psp* and 52*psp* in this way, the number of signal terminals 80 can be reduced regardless of the drive period of the switching elements 51 and 52.

Further, in FIG. 27, the signal terminal 80 corresponding to the current sense pad 52*psc* is not provided. The substrate area of the second switching element 52 is smaller than the substrate area of the first switching element 51. As described above, the on-resistance of the MOSFET 112 increases as the temperature rises. Therefore, in the high temperature region, the on-resistance of the first switching element 51 is smaller than that of the second switching element 52. Therefore, even if the switching elements 51 and 52 are turned on at the same time, a current tends to flow through the first switching element 51 in the high temperature region. Therefore, the signal terminal 80 of the current sense pad 52*psc* can be omitted. Even when the second switching element 52 is driven on only in a small current region, the signal terminal 80 of the current sense pad 52*psc* can be omitted. As described above, in the configuration shown in FIG. 27, the number of signal terminals 80 is 11.

In FIG. 27, the signal terminals 80 of the reference potential pads 51*psp* and 52*psp* are shared by the first switching element 51*b* on the downstream side and the second switching element 52, but the present disclosure is not limited to this example. When the reference potential pad 51*psp* is provided on the most downstream side and the reference potential pad 52*psp* is provided on the most upstream side, the signal terminals 80 of the reference potential pads 51*psp* and 52*psp* can be shared for the switching elements 51*a* and 52.

Figure 28:
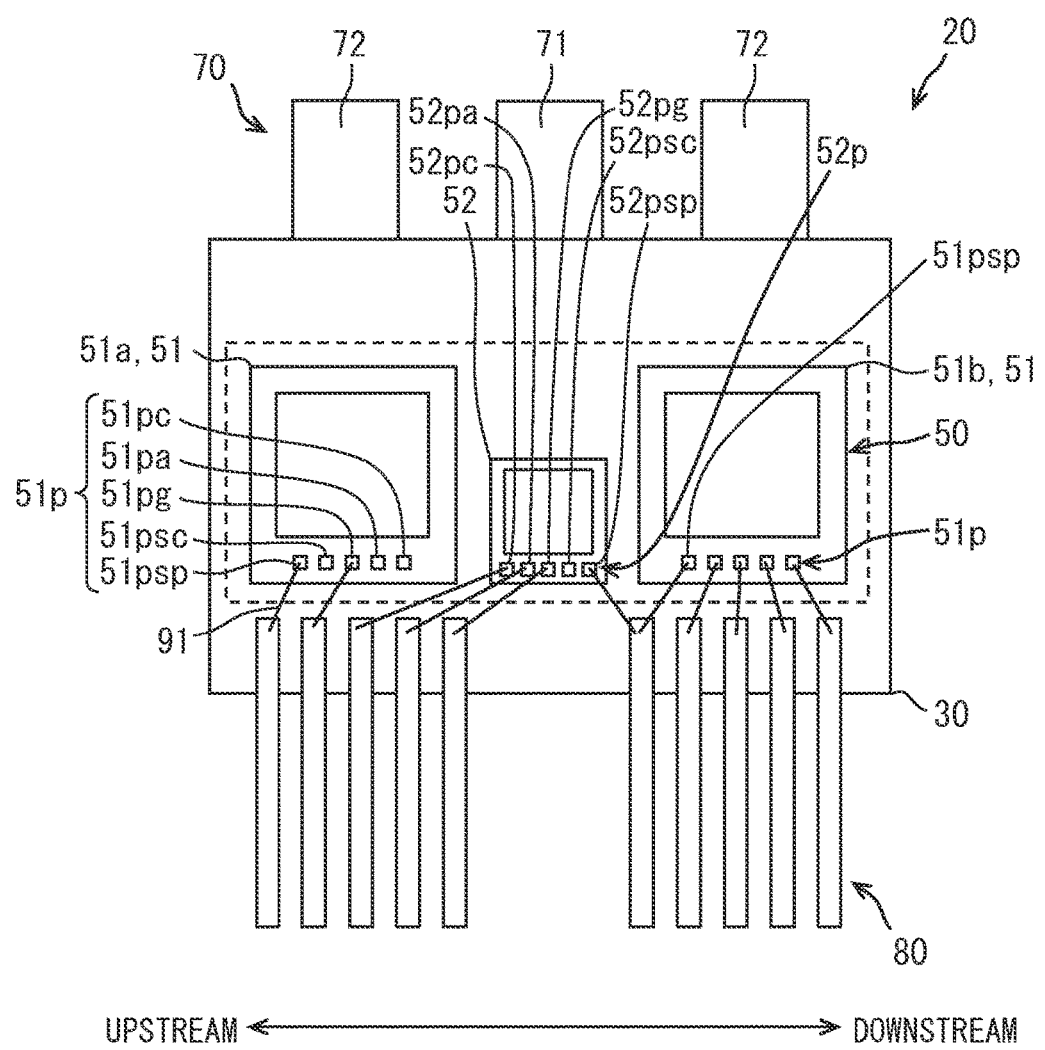
FIG. 28 is a diagram showing a semiconductor device according to another modification.

A modification shown in FIG. 28 has a configuration in which the signal terminal 80 corresponding to the current sense pad 51*psc* of the first switching element 51*a* is omitted from FIG. 27. The substrate temperature of the first switching element 51*a* on the upstream side becomes lower than the substrate area of the first switching element 51*b* on the downstream side due to the refrigerant. The on-resistance of the IGBT 111 decreases when the substrate temperature rises. Therefore, in the high temperature region, a current tends to flow through the first switching element 51*b*. Therefore, the signal terminal 80 corresponding to the current sense pad 51*psc* on the upstream side can be omitted. Accordingly, in the configuration shown in FIG. 27, the number of signal terminals 80 is 11.

Figure 29:
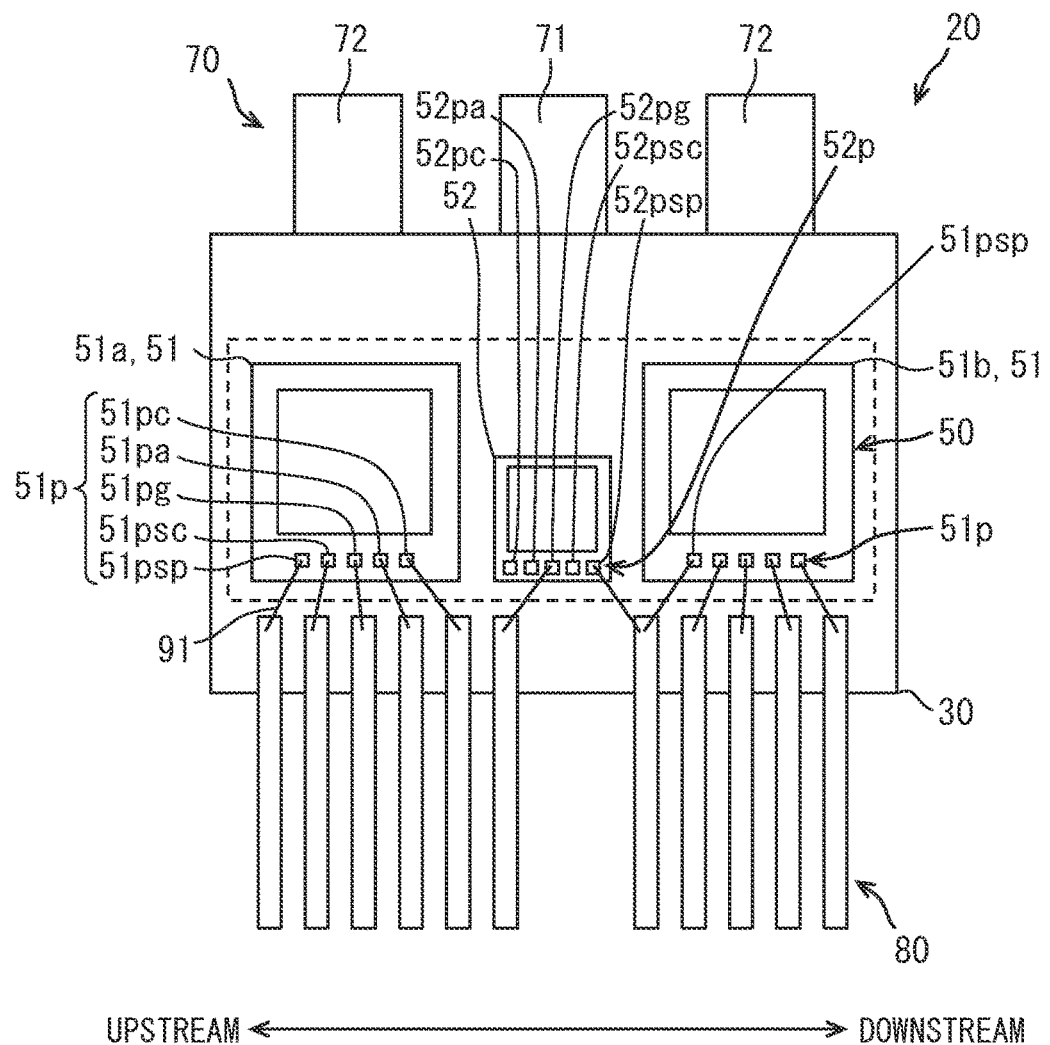
FIG. 29 is a diagram showing a semiconductor device according to another modification.
Figure 29:
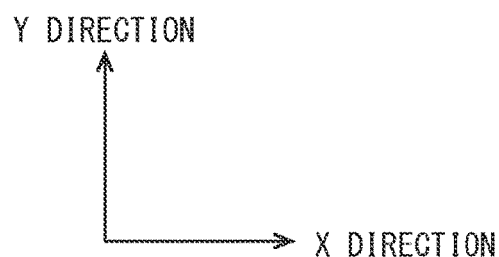

In a modification shown in FIG. 29, the arrangement order of the pads 51*p* and 52*p* is the same as that in FIG. 27. The signal terminal 80 is not provided for the temperature sense pads 52*pa* and 52*pc* and the current sense pad 52*psc* of the second switching element 52. The other pads 51*p* and 52*p* are connected to the signal terminals 80. Then, the reference potential pad 51*psp* of the first switching element 51*b* and the reference potential pad 52*psp* of the second switching element 52 are connected to the same signal terminal 80 in a manner similar to the modification shown in FIG. 27. Accordingly, the number of signal terminals 80 can be reduced.

The switching elements 51 and 52 may be driven on for different periods and may not be driven on for the same period. The second switching element 52 is driven on in the first current region, and the first switching elements 51 are driven on in the second current region. There is no setting for the third current range. Since the second switching element 52 is not driven on in the large current region, the signal terminal 80 corresponding to the current sense pad 52*psc* can be omitted. Further, since the second switching element 52 is driven on only in the small current region, the signal terminals 80 corresponding to the temperature sense pads 52*pa* and 52*pc* can be omitted. Accordingly, as shown in FIG. 29, the number of signal terminals 80 can be set to 11.

Further, the three switching elements 50 may satisfy the relationship of electrical characteristics shown below. For example, the gate threshold voltage Vth satisfies the relationship of the first switching element 51*a*>the first switching element 51*b*. The on-voltage Von (RT) at room temperature satisfies the relationship of the first switching element 51*a*>the first switching element 51*b*>the second switching element 52. The on-voltage Von (HT) at a high temperature (for example, 100° C.) satisfies the relationship of the second switching element 52>the first switching element 51*a*>the first switching element 51*b*. In this case, the maximum current and the maximum temperature can be detected by monitoring the first switching element 51*b*. Therefore, the signal terminal 80 corresponding to the current sense pad 52*psc* can be omitted. Further, the signal terminals 80 corresponding to the temperature sense pads 52*pa* and 52*pc* can be omitted. Accordingly, as shown in FIG. 29, the number of signal terminals 80 can be set to 11.

Figure 30:
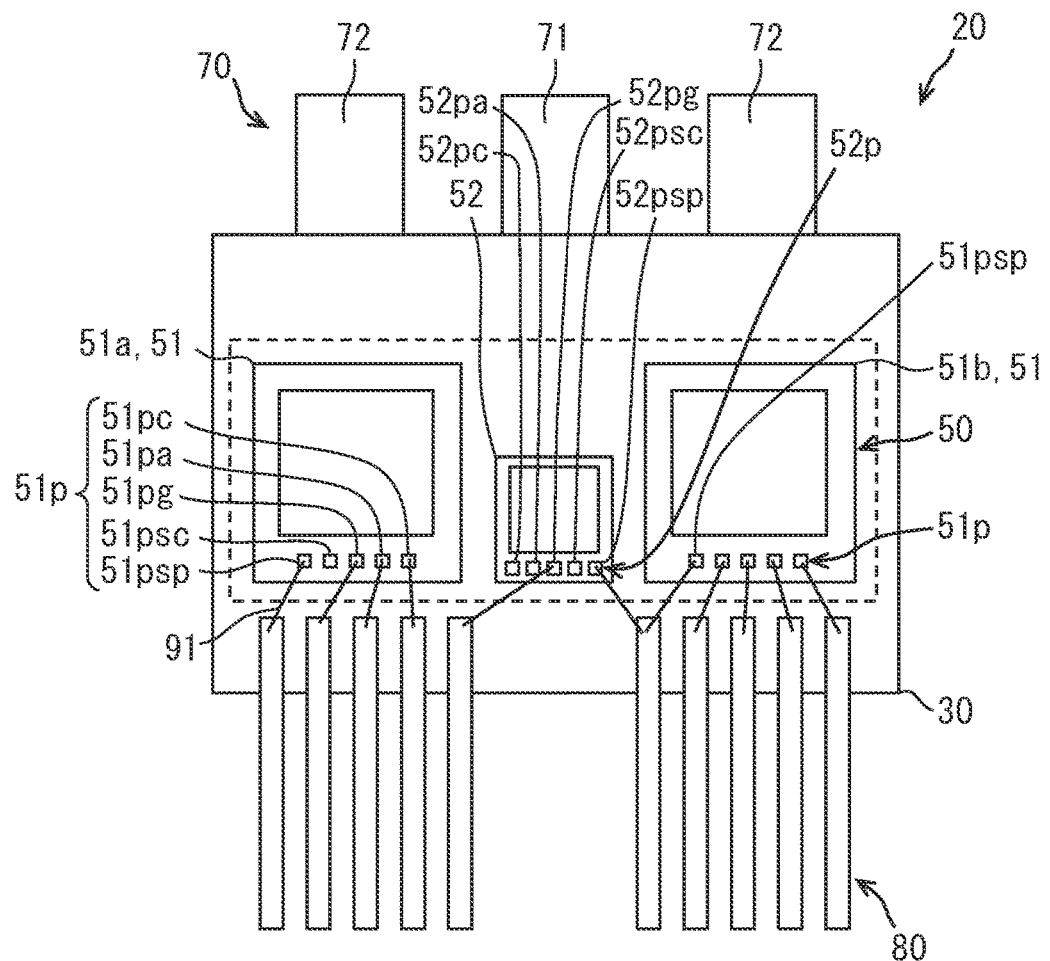
FIG. 30 is a diagram showing a semiconductor device according to another modification.
Figure 30:
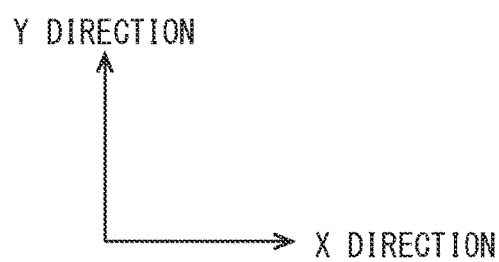

A modification shown in FIG. 30 has a configuration in which the signal terminal 80 corresponding to the current sense pad 51*psc* of the first switching element 51*a* is omitted from FIG. 29. Similar to the modification shown in FIG. 28, since the substrate temperature of the first switching element 51*a* on the upstream side is lowered by the refrigerant, the signal terminal 80 corresponding to the current sense pad 51*psc* on the upstream side can be omitted. Accordingly, in the configuration shown in FIG. 27, the number of signal terminals 80 is 11.

Figure 31:
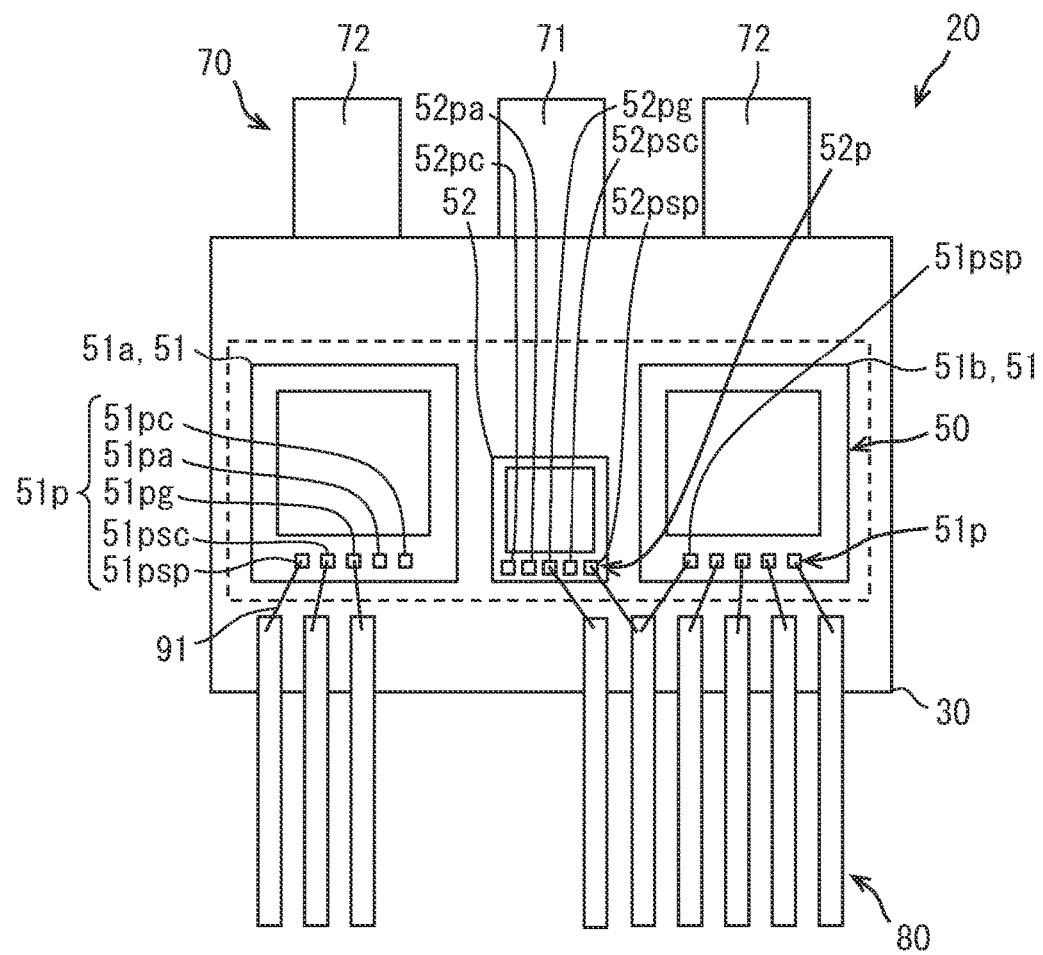
FIG. 31 is a diagram showing a semiconductor device according to another modification.
Figure 31:
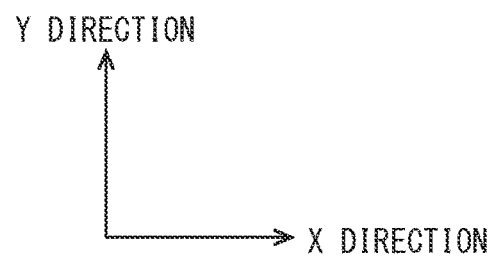

It should be noted that the configurations of FIGS. 29 and 30 and the configuration shown in FIG. 25 can be combined. For example, a modification shown in FIG. 31 has a configuration in which the signal terminals 80 of the temperature sense pads 51*pa* and 51*pc* of the first switching element 51*a* are omitted from FIG. 29. Accordingly, the number of signal terminals 80 is nine.

In a modification shown in FIG. 29, the arrangement order of the pads 51*p* and 52*p* is the same as that in FIG. 27. The signal terminal 80 is not provided for the reference potential pads 51*psp* and 52*psp* of the switching elements 51*a*, 51*b* and 52. The other pads 51*p* and 52*p* are connected to the signal terminals 80. The potentials of the reference potential pads 51*psp* and 52*psp* are the same as the potentials of the low potential terminal 72. By sharing with the low potential terminal 72, the signal terminals 80 corresponding to the reference potential pads 51*psp* and 52*psp* can be omitted. Accordingly, in the configuration shown in FIG. 32, the number of signal terminals 80 is 11.

Figure 32:
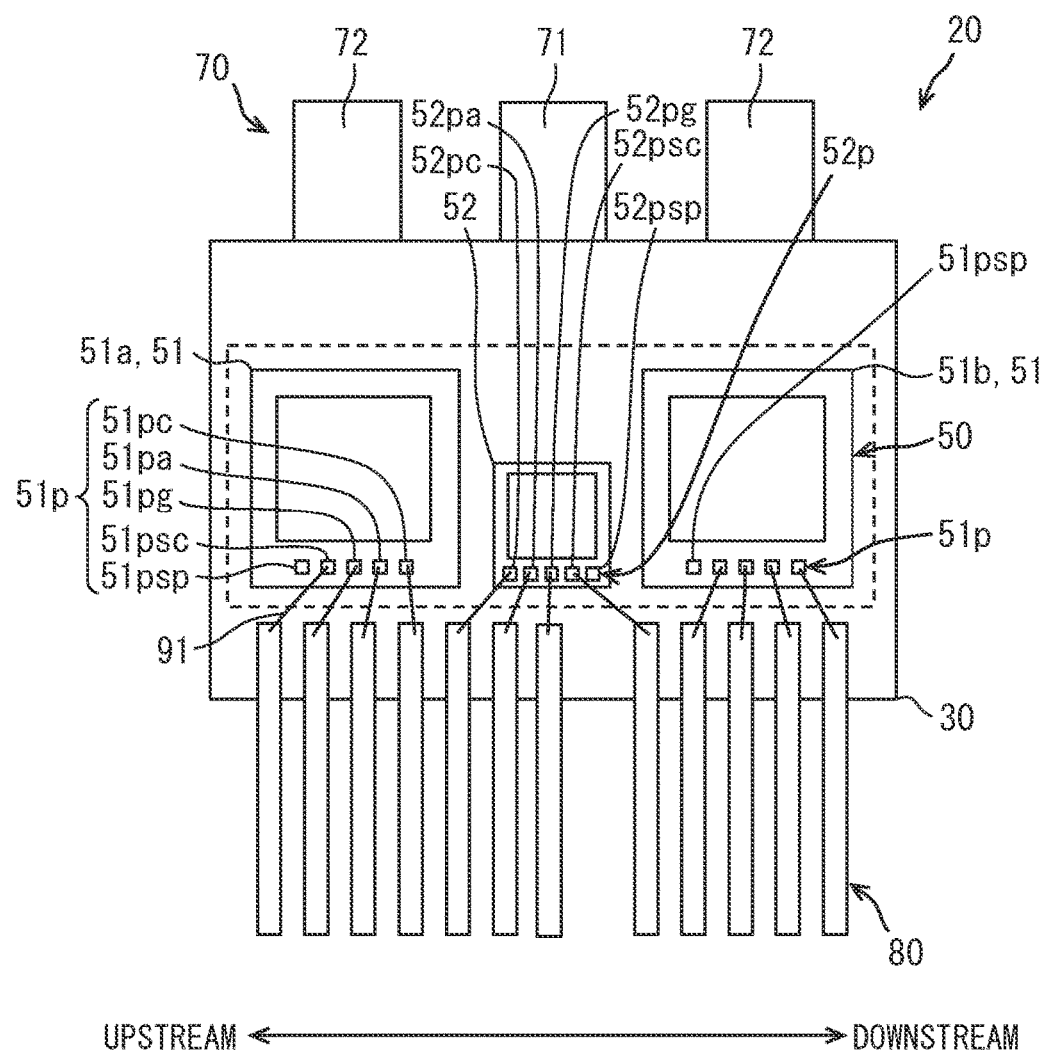
FIG. 32 is a diagram showing a semiconductor device according to another modification.
Figure 32:
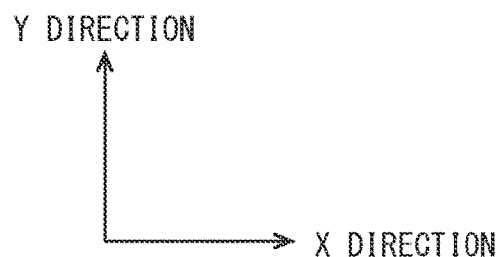
Figure 33:
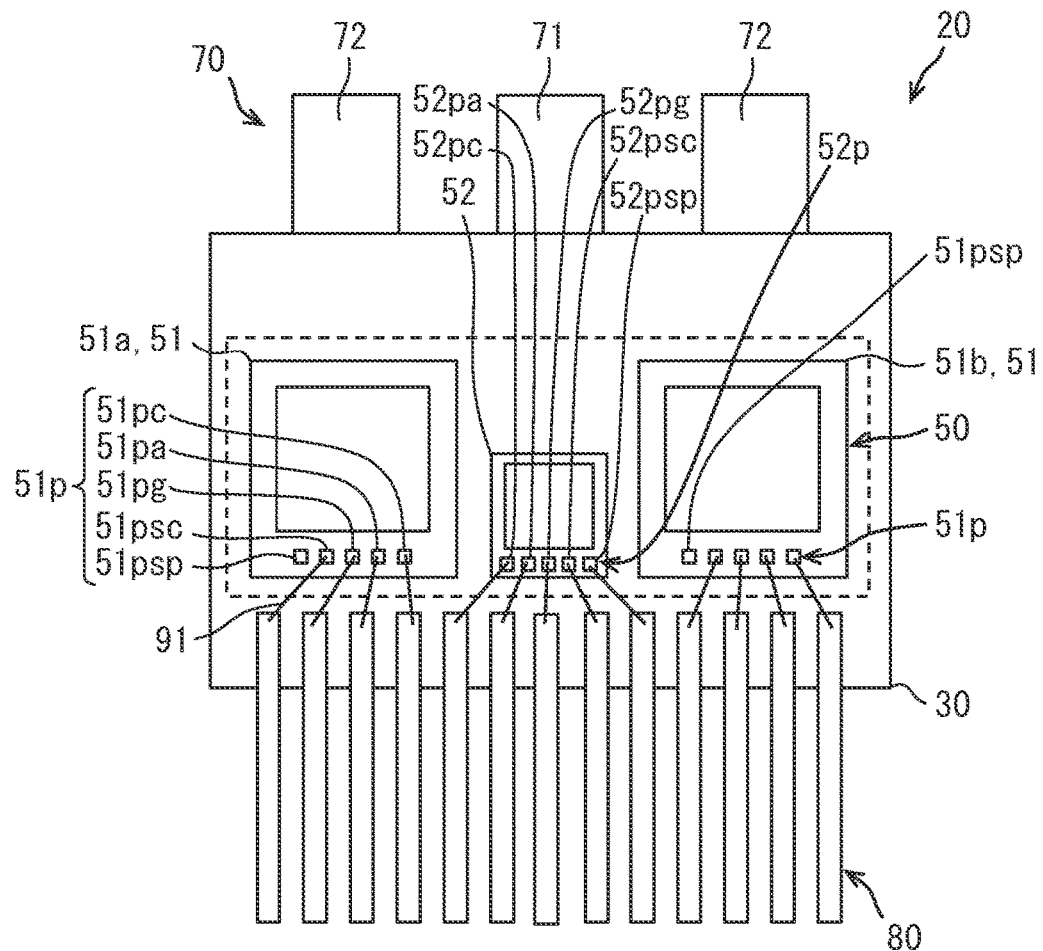
FIG. 33 is a diagram showing a semiconductor device according to another modification.

When the second switching element 52 (the MOSFET 112) is switched at high speed, the signal terminal 80 corresponding to the reference potential pad 52*psp* may be added to FIG. 32 as in a modification shown in FIG. 33. Accordingly, the inductance is reduced as compared with the configuration shown in FIG. 32, and high-speed switching of the second switching element 52 becomes possible. In the configuration shown in FIG. 33, the number of signal terminals 80 is 13.

The configuration shown in the present embodiment can be combined with the preceding embodiments. For example, the configuration according to the present embodiment may be combined with a configuration in which a part of the heat dissipation members 40 is exposed from the sealing resin body 30, or a configuration in which the entire heat dissipation members 40 are covered by the sealing resin body 30. The configuration according to the present embodiment may be combined with a configuration using different semiconductor devices 20U and 20L for the upper arm 11U and the lower arm 11L. The configuration according to the present embodiment may be combined with a configuration using the semiconductor devices 20 having the same structure for the upper arm 11U and the lower arm 11L. At least one of the heat dissipation members 40, the switching elements 50, or the main terminals 70 may be arranged in linearly symmetric with respect to the virtual line CL1. A second switching element 52 having the Y direction as the longitudinal direction may be adopted.

Other Embodiments

The disclosure in this specification and drawings etc. is not limited to the above-described embodiments. The disclosure encompasses the above-described embodiments and modifications based on the embodiments by those skilled in the art. For example, the disclosure is not limited to the combinations of parts and/or elements shown in the embodiments. The present disclosure may be implemented in various combinations. The disclosure may have additional parts that may be added to the embodiments. The disclosure covers omissions of parts and/or elements of the embodiments. The disclosure covers replacement or combination of components, elements between one of the embodiments and another. The disclosed technical scope is not limited to the description of the embodiments. The several technical ranges disclosed are indicated by the description of the claims, and should be construed to include all modifications within the meaning and range equivalent to the description of the claims.

The disclosure in the specification, drawings and the like is not limited by the description of the claims. The disclosures in the specification, the drawings, and the like encompass the technical ideas described in the claims, and further extend to a wider variety of technical ideas than those in the claims. Therefore, various technical ideas can be extracted from the disclosure of the specification, the drawings and the like without being limited to the description of the claims.

The control circuit 7 and the drive IC 8 are provided by a control system including at least one computer. The computer includes at least one processor (hardware processor) that is hardware. The hardware processor may be provided by the following (i), (ii), or (iii).

(i) The hardware processor may be a hardware logic circuit. In this case, the computer is provided by a digital circuit including a number of programmed logic units (gate circuits). The digital circuit may comprise a memory for storing programs and/or data. The computer may be provided by an analog circuit. A computer may be provided by a combination of a digital circuit and an analog circuit.

(ii) The hardware processor may be at least one processor core that executes a program stored in at least one memory. In this case, the computer is provided by at least one memory and at least one processor core. The processor core is called, for example, a CPU. The memory is also called a storage medium. The memory is a non-transitory and tangible storage medium, which non-temporarily stores a program and/or data readable by the processor.

(iii) The hardware processor may be a combination of (i) and (ii) described above. (i) and (ii) are placed on different chips or on a common chip.

That is, the means and/or functions provided by the control circuit 7 and the drive IC 8 can be provided by hardware only, software only, or a combination thereof.

The relationship between the thicknesses of the switching elements 51 and 52 is not limited to the above example. For example, the thicknesses of the switching elements 51 and 52 may be substantially equal to each other.

An example is shown in which the semiconductor device 20 includes the terminal 60, but the present disclosure is not limited thereto. For example, by providing a convex portion on the mounting surface 42a of the second heat dissipation member 42, the terminal 60 may be omitted.

An example in which the RC-IGBT is formed on the first switching element 51 has been shown, but the present disclosure is not limited to this example. The IGBT 111 may be formed on the first switching element 51, and the diode 113 may be formed on a chip separate from the switching elements 50.

The semiconductor device 20 is not limited to the double-sided heat dissipation structure. The present disclosure can also be applied to a semiconductor of a single-sided heat dissipation structure that includes one heat dissipation member 40 having a surface to which the main electrodes on the high potential side or the main electrodes on the low potential side of the switching elements 51 and 52 are connected. In the case of a single-sided heat dissipation structure, the mounting surface of the switching elements 51 and 52 and/or the rear surface in the heat dissipation member may be exposed.

As the semiconductor device 20, an example of a 1-in-1 package that is packaged in a unit of elements forming one arm has been shown, but the present disclosure is not limited to this example. The present disclosure can also be applied to a configuration including multiple arms in which switching elements 51 and 52 are connected in parallel to the heat dissipation member. For example, the present disclosure can also be applied to a 2-in-1 package that includes elements forming the upper arm 11U and elements forming the lower arm 11L.

What is claimed is:

1. A semiconductor device to be cooled by a refrigerant, comprising:
    a heat dissipation member;
    a plurality of switching elements each including a main electrode through which a main current flows and a plurality of pads, the main electrode in each of the switching elements being electrically connected to the heat dissipation member and the switching elements being connected in parallel with each other, the switching elements including a first switching element formed on a silicon substrate and a second switching element formed on a silicon carbide substrate; and
    a plurality of signal terminals electrically connected with the pads, wherein
    each of the switching elements includes, as one of the pads, a temperature sense pad for detecting a substrate temperature,
    the switching elements include at least one of the first switching element or the second switching element in a plural number,
    the first switching element and the second switching element are alternately arranged in a predetermined direction in which the refrigerant flows, and
    in the switching elements of same type as the switching element disposed on a most downstream side in the predetermined direction, the signal terminal corresponding to the temperature sense pad is provided for a part of the switching elements including the switching element disposed on the most downstream side, and is not provided for a remaining part of the switching elements disposed on more upstream side than the part of the switching elements.

2. The semiconductor device according to claim 1, wherein
    the first switching element is an integrated gate bipolar transistor (IGBT),
    the second switching element is a metal-oxide semiconductor field-effect transistor (MOSFET),
    the switching elements include the two first switching elements and the one second switching element,
    the second switching element is disposed between the first switching elements in the predetermined direction,
    each of the switching elements includes, as one of the pads, a gate pad to which a gate drive electrode is input, and
    the signal terminal corresponding to the temperature sense pad is provided for the first switching element disposed on the most downstream side and is not provided for the first switching element disposed on the upstream side.

3. The semiconductor device according to claim 2, wherein
    in each of the switching elements, the pads are arranged in the predetermined direction,
    each of the switching elements includes, as one of the pads, a reference potential pad for detecting a reference potential with respect to the gate drive signal,
    the reference potential pad is disposed on one end side in each of the first switching elements, the reference potential pad is disposed on an opposite end side in the second switching element, and the opposite end side is opposite from the one end side in the predetermined direction, and
    the reference potential pad of one of the first switching elements and the reference potential pad of the second switching element disposed adjacent to each other in the predetermined direction are connected to same one of the signal terminals.

4. The semiconductor device according to claim 2, wherein
    each of the switching elements includes, as one of the pads, a current sense pad.

5. The semiconductor device according to claim 4, wherein
    the signal terminal corresponding to the current sense pad is provided for the first switching element disposed on the most downstream side and is not provided for the second switching element.

6. The semiconductor device according to claim 4, wherein
    the signal corresponding to the current sense pad is provided for the first switching element disposed on the most downstream side and is not provided for the first switching element disposed on the upstream side.

7. The semiconductor device according to claim 4, wherein
    the first switching is tuned off in a first current region and is turned on in a second current region larger than the first current region,
    the second switching element is turned on in the first current region and is turned off in the second current region,
    the signal terminal corresponding to the current sense pad is provided for the first switching element disposed on the most downstream side and is not provided for the second switching element, and
    the signal terminal corresponding to the temperature sense pad is provided for the first switching element disposed on the most downstream side and is not provided for the second switching element.

* * * * *